United States Patent
Yoshida

(10) Patent No.: US 9,063,023 B2
(45) Date of Patent: *Jun. 23, 2015

(54) VIBRATION TRANSDUCER AND ITS MANUFACTURING METHOD

(75) Inventor: Takashi Yoshida, Tokyo (JP)

(73) Assignee: YOKOGAWA ELECTRIC CORPORATION, Tokyo (JP)

(*) Notice: Subject to any disclaimer, the term of this patent is extended or adjusted under 35 U.S.C. 154(b) by 754 days.

This patent is subject to a terminal disclaimer.

(21) Appl. No.: 13/228,855

(22) Filed: Sep. 9, 2011

(65) Prior Publication Data

US 2012/0060607 A1   Mar. 15, 2012

(30) Foreign Application Priority Data

Sep. 10, 2010   (JP) ................................ 2010-203032

(51) Int. Cl.
*G01L 9/08* (2006.01)
*G01H 13/00* (2006.01)
*G01L 9/00* (2006.01)
(Continued)

(52) U.S. Cl.
CPC .............. *G01L 9/0019* (2013.01); *G01L 1/106* (2013.01); *G01L 9/0013* (2013.01); *B81B 3/001* (2013.01); *B81B 2201/025* (2013.01); *B81B 2201/0264* (2013.01); *B81B 2201/0285* (2013.01); *B81B 2203/0118* (2013.01)

(58) Field of Classification Search
CPC ........ G01H 1/00; G01H 13/00; G01L 9/0019; G01L 9/0013; G01L 1/106; B81B 3/001; B81B 2201/0285; B81B 2201/025; B81B 2201/0264; B81B 2203/0118; B81B 2203/0109

USPC ........................................... 73/579, 662, 651
See application file for complete search history.

(56) References Cited

U.S. PATENT DOCUMENTS 5,123,282 A *  6/1992  Ikeda et al. ..................... 73/704
5,146,787 A    9/1992  Thomas et al.
(Continued)

FOREIGN PATENT DOCUMENTS

JP   2005-037309 A   2/2005

OTHER PUBLICATIONS

European Search Report issued on Dec. 19, 2011 by the European Patent Office in the corresponding European Patent Application No. 11180829.1.

(Continued)

*Primary Examiner* — Laura Martin
*Assistant Examiner* — Rose M Miller
(74) *Attorney, Agent, or Firm* — Sughrue Mion, PLLC

(57) ABSTRACT

A vibration transducer includes a silicon single crystal vibration beam provided over a silicon single crystal substrate, the vibration beam having a sectional shape that is longer in a direction perpendicular to a surface of the silicon single crystal substrate than in a direction parallel with it, a shell made of silicon, surrounding the vibration beam with a gap, and forming a vacuum room together with the silicon single crystal substrate, a plate-like first electrode plate disposed parallel with the surface of the silicon single crystal substrate, the first electrode plate having one end connected to the vibration beam, plate-like second and third electrode plates disposed parallel with the surface of the silicon single crystal substrate so as to be opposed to each other with the vibration beam interposed in between, and asperities formed on confronting side surfaces of the vibration beam and the second and third electrode plates.

6 Claims, 39 Drawing Sheets

(51) Int. Cl.
*G01L 1/10* (2006.01)
*B81B 3/00* (2006.01)

(56) References Cited

U.S. PATENT DOCUMENTS

| | | | | |
|---|---|---|---|---|
| 5,417,115 | A | * 5/1995 | Burns | 73/778 |
| 5,747,705 | A | 5/1998 | Herb et al. | |
| 7,067,344 | B1 | * 6/2006 | Oguchi | 438/53 |
| 8,445,977 | B2 | * 5/2013 | Yoshida | 257/416 |
| 2002/0157473 | A1 | * 10/2002 | Stemme et al. | 73/704 |
| 2007/0044565 | A1 | * 3/2007 | Aratake | 73/662 |
| 2010/0194407 | A1 | 8/2010 | Nakatani | |

OTHER PUBLICATIONS

Communication issued on Jan. 20, 2015 by the European Patent Office in related application No. 11180829.

* cited by examiner

VIBRATION TRANSDUCER AND ITS MANUFACTURING METHOD

TECHNICAL FIELD

The present invention relates to a vibration transducer and its manufacturing method.

RELATED ART

FIGS. 28-37 illustrate an important part of a related-art vibration transducer which is used commonly. FIG. 28 shows the configuration of an important part of a vibration transducer assembly, and FIGS. 29-37 illustrate a manufacturing process.

The manufacturing process will be described below.

First, as shown in FIG. 29, a silicon oxide film 10a is formed on an n-type silicon single crystal substrate 1 and then patterned.

A recess is formed in the substrate 1 with undercutting through a removed portion of the oxide film 10a, and $p^+$ single crystal silicon having a boron concentration $10^{18}$ cm$^{-3}$ is grown in the recess by selective epitaxial growth to form a $p^+$ single crystal silicon layer 11.

Then, $p^{++}$ single crystal silicon 12a having a boron concentration of $3\times10^{19}$ cm$^{-3}$ or higher is grown on the surface of the $p^+$ single crystal silicon layer 11. The $p^+$ single crystal silicon layer 11 and the $p^{++}$ single crystal silicon layer 12a will later become a gap under a vibration beam and the vibration beam, respectively.

Then, as shown in FIG. 30, a silicon oxide film 10b is formed on the entire substrate surface including the surface of the $p^{++}$ single crystal silicon layer 12a, and then patterned. A shell grounding portion to the substrate 1 will be formed in a recess D which is a removed portion of the oxide film 10b.

Then, as shown in FIG. 31, a silicon nitride film 13 is formed on the entire substrate surface (also formed in the recess D), and then patterned. The silicon oxide film 10b and the silicon nitride film 13 on or over the $p^{++}$ single crystal silicon layer 12a (vibration beam) will become a gap over the vibration beam. The capacitance is determined by the thickness of the silicon oxide film 10b and the silicon nitride film 13 combined and the area of the vibration beam. Therefore, an optimum value of the capacitance for driving of the vibration beam and detection can be obtained by adjusting the above thickness and area properly.

Then, as shown in FIG. 32, $p^{++}$ polysilicon 14 is formed on the entire surface and then patterned to form an etching liquid introduction hole E for etching of a sacrificial layer. The $p^{++}$ polysilicon 14 will later become a shell and electrode lead-out interconnections. Interconnections may be formed by using the $p^+$ single crystal silicon layer 11 or the $p^{++}$ single crystal silicon layer 12a or performing impurity diffusion into the silicon substrate 1 before the selective epitaxial growth. It is preferable that interconnections be formed by a method that minimizes the parasitic capacitance between itself and the silicon substrate 1.

Then, as shown in FIG. 33, hydrofluoric acid is introduced through the etching liquid introduction hole E, whereby the silicon nitride film 13 and the silicon oxide film 10b are removed. In the shell grounding portion, the silicon nitride film 13 serves as an etching stop layer in the lateral direction because of a slow etching rate of silicon nitride.

Then, as shown in FIG. 34, the $p^+$ single crystal silicon layer 11 is removed using an alkali solution (e.g., hydrazine, KOH, or TMAH). At this time, neither the $p^{++}$ single crystal silicon layer 12a nor the $p^{++}$ polysilicon layer 14 is etched because of the high impurity concentration.

The n-type silicon substrate 1 can be protected from the etching with the alkali solution by applying a voltage of 1 to 2 V to it during the etching. The etching in the longitudinal direction of the vibration beam is stopped utilizing the fact that the etching rate of a silicon single crystal in the <111> direction is low.

Then, as shown in FIG. 35, the etching liquid introduction hole E is closed by forming a sealing member 15 by sputtering, evaporation, CVD, epitaxial growth, or the like (e.g., an $SiO_2$ member, a glass member, or a like member is formed by sputtering), whereby a very small vacuum room 5 is formed.

Before this step, the electrical insulation between the shell and the vibration beam may be made more stable by, for example a method of forming a silicon oxide film on the surface of the vibration beam and the inner surfaces to define the vacuum mom 5 by thermal oxidation or the like. In this case, the sealing member 15 may be made of a conductive material.

Then, as shown in FIG. 36, interconnections extending from the vibration beam and the shell, and bonding pad electrodes are formed by patterning the $p^{++}$ polysilicon layer 14.

Finally, as shown in FIG. 37, a diaphragm 2 is formed by thinning the silicon substrate 1 from the back side.

FIG. 38A is a plan view showing interconnections 20 which have been formed by patterning the $p^{++}$ polysilicon layer 14 so as to extend from the vibration beam and the shell, as well as bonding pad Al electrodes 21.

FIG. 38B is a circuit diagram of the related-art vibration transducer. In FIG. 38B, reference symbol Vb represents a bias voltage (constant voltage); Vi, a drive voltage (AC); R1 and R2, wiring resistances; and R3, a substrate resistance. Reference symbol C1 represents a vibration beam/shell capacitance; C2, a parasitic capacitance; and C3 and C4, interconnection/substrate capacitances. The noise current decreases as the resistance R3 and the capacitances C2-C4 become smaller. Since the values of these circuit parameters are determined by an interconnection forming method, patterns, etc., the interconnection forming method, the patterns, etc. are determined so as to minimize the values of these circuit parameters.

As is understood from FIG. 38B, if the vibration beam/shell capacitance C1 is constant, the amplitude of an output current is proportional to $(C1+C2)\cdot Vi\cdot\omega$, where $\omega$ is the frequency of the voltage Vi.

On the other band, if the capacitance C1 resonates at the frequency $\omega$, a current whose amplitude is approximately proportional to $\Delta C1\cdot Vb\cdot\omega$ is added, where $\Delta C1$ is a variation of the capacitance C1 which is caused by the resonance. A resonance frequency is detected on the basis of this current increase.

PRIOR ART DOCUMENTS

Patent Documents

[Patent document 1] JP-A-2005-037309

The above-described device has the following problems.

In the related-art vibration transducer of FIG. 28, the manufacturing process includes many processing steps because the vibration beam vibrates perpendicularly to the substrate 1 and the vibration beam, the excitation electrode, and the vibration detection electrodes are stacked. A structure utilizing electrostatic force necessarily becomes complex because it is necessary to form, in addition to the vibration beam, electrodes for exciting the vibrator or detecting vibration need to be formed in a vacuum room and the electrodes need to be insulated from each other.

In the stack structure, the vibration beam and the counter electrode are opposed to each other in the vertical direction, they require separate processing steps. Therefore, to manufacture a vibration transducer having a stack structure using micromachining technology, the number of masks is increased and the number of processing steps is increased accordingly, as a result of which the lead time is elongated and the manufacturing cost is increased. The increased number of processing steps may cause, accumulation of processing accuracy-related variations and thereby result in degradation of characteristics. This is a factor in causing yield reduction.

Furthermore, where electrostatic force is utilized, the distances between the vibration beam, the drive electrode, and the detection electrode usually need to be of submicron order (about 1 µm at the maximum). However, to increase the frequency variation factor (gauge factor) of a vibration transducer with respect to strain, it is necessary to increase the length l of the vibration beam and decrease its thickness t. This leads to a problem that the vibration beam is stuck to an electrode to render the device inoperative. This problem not only occurs during a sacrificial-etching due to surface tension of water but also occurs after manufacture (during operation).

The following equation holds between the resonance frequency f of the vibration beam and the strain $\epsilon_s$:

$$f = \alpha \frac{t}{l^2}\sqrt{1 + \beta\left(\frac{l}{t}\right)^2 \epsilon_s + \gamma \frac{l^4}{h^3 t^3} V_b^2} \quad \text{[Formula 1]}$$

where
α, β, and γ: proportionality constants;
$V_b$: bias voltage for causing electrostatic attraction;
t: thickness of the vibration beam;
l: length of the vibration beam;
$\epsilon_s$: tensile strain of the vibration beam; and
h: distance between the vibration beam and the confronting surface.

As seen from the above equation, a linear relationship exists between the square of the frequency and the strain. Therefore, when the bias voltage $V_b=0$ (V), the rate of change of the square of the frequency f with the strain $\epsilon_s$ divided by $f^2$ (squared gauge factor $Gf^2$) is obtained as follows:

$$Gf^2 = \left(\frac{\delta f^2}{f^2}\right) \div \partial \epsilon_s = \left(\frac{\frac{\partial f^2}{\partial s_2}}{f^2}\right) = \frac{1}{\frac{1}{\beta\left(\frac{l}{t}\right)^2} + \epsilon_s} \quad \text{[Formula 2]}$$

where
$Gf^2$: ratio of the change $\delta f^2$ of the square of the frequency f divided by $f^2$ to the change $\delta\epsilon_s$ of the strain $\epsilon_s$ of the vibration beam;
t: thickness of the vibration beam;
l: length of the vibration beam; and
$\epsilon_s$: tensile strain of the vibration beam.

FIG. 39 is a graph corresponding to this equation. The graph includes two curves corresponding to cases that the ratio l/t of the length l of the vibration beam to its thickness t is 200 and 140, respectively. When the tensile strain of the vibration beam is approximately equal to 0µε, the relationship between the squared gauge factor $Gf^2$ and the strain $\epsilon_s$ becomes $\beta(l/t)^2$ which corresponds to y intercepts in FIG. 39. When the tensile strain of the vibration beam is approximately equal to 0µε, the black-circle curve (l/t=200) has a value that is approximately two times a value of the white-circle curve (l/t=140).

This means that in a low-tensile strain range the squared gauge factor $Gf^2$ is large when the length l of the vibration beams is great and its thickness t is small.

On the other hand, when the tensile strain of the vibration beam is relatively high (higher than 350µε), the relationship between the squared gauge factor $Gf^2$ and the strain $\epsilon_s$ gradually approximates $1/\epsilon_s$ which means a chord vibration limit. Therefore, the squared gauge factor $Gf^2$ is almost irrelevant to the shape of the vibration beam and is determined by the magnitude of the strain $\epsilon_s$. The squared gauge factor $Gf^2$ decreases as the tensile strain becomes lower.

The above discussion shows that in manufacturing a high-sensitivity vibration transducer that is highly sensitive to strain it is desirable that the vibration beam be long and thin and the tensile strain applied to it be relatively low.

Furthermore, where the vibration beam is driven by electrostatic force, the electrostatic force does not act on the vibration beam effectively unless the distance between the drive electrode and the vibration beam is as short as about 1 µm.

On the other hand, such a vibration beam which is long and thin, receives low tensile strain, and has a short distance between the confronting electrodes is destined to stick to the confronting surface. The following equation is effective in explaining this phenomenon.

$$Np = \left(\frac{128 E h^2 t^3}{5\gamma_s l^4}\right)\left[1 + \frac{4\sigma_R l^2}{21 E t^2} + \frac{256}{2205}\left(\frac{h}{l}\right)^2\right] \quad \text{[Formula 3]}$$

where
E: Young's modulus of silicon;
$\sigma_R$: tensile stress on the vibration beam;
$\gamma_s$: adhesion energy;
t: thickness of the vibration beam;
l: length of the vibration beam; and
h: distance to the confronting surface.

This equation is used for judging the sticking tendency of a double-end-supported beam. A vibration beam sticks when Np (peel number) is equal to 1.

As easily understood from this equation, when the tensile strain is low, it suffices to consider only the first term and, in this case, Np decreases as the length l becomes greater. Np also decreases as the thickness t and the inter-electrode distance h become small.

As is understood from the above description, it is not an overstatement that whether an electrostatic driving type vibration transducer can be increased in sensitivity depends on whether the problem of sticking can be solved.

SUMMARY

Exemplary embodiments of the present invention provide a vibration transducer and its manufacturing method which can solve the problem of sticking.

More specifically, the exemplary embodiments of the present invention provide the following vibration transducer:
(1) To provide a vibration transducer having a silicon single crystal beam with high accuracy at a low cost.

(2) To provide a vibration transducer which can provide a simple but effective countermeasure against sticking of the vibration beam.

(3) To provide a vibration transducer which can perform pressure measurement in a wide dynamic range because it is capable of self-oscillation with a double-end-fixed beam having a smallest number of vibration modes and hence it is free of mode crossing in a measurement range and can be used in a wide frequency bandwidth.

(4) To provide a vibration transducer in which a vibration mode can be selected by setting the number of electrodes to a particular number or employing a particular excitation method.

(5) To provide a vibration transducer which can make less likely reduction of the Q value of the vibration beam due to diaphragm resonance which is a drawback of vibration transducers by making it possible to shape the vibration beam freely in two dimensions and thereby give it a shape that is effective in increasing the vibration stability.

(6) To provide a vibration transducer in which the vibration beam has increased strain sensitivity, the diaphragm is reduced in size, and the withstanding pressure is high because the vibration beam has a sectional shape that is long in the vertical direction and short in the horizontal direction and hence the shell width is narrow and the withstanding pressure of a vacuum room is high even with a shell is thin which is a pressure partition.

A vibration transducer according to a first aspect of the invention, comprises:

a silicon single crystal substrate;

a silicon single crystal vibration beam provided over the silicon single crystal substrate, the vibration beam having a sectional shape that is longer in a direction that is perpendicular to a surface of the silicon single crystal substrate than in a direction that is parallel with the surface of the silicon single crystal substrate;

a shell made of silicon, surrounding the vibration beam with a gap, and forming a vacuum room together with the silicon single crystal substrate;

an exciting module configured to excite the vibration beam;

a vibration detecting module configured to detect vibration of the vibration beam, and to measure stress occurring in the vibration beam by measuring a resonance frequency of the vibration beam;

a plate-like first electrode plate disposed parallel with the surface of the silicon single crystal substrate, the first electrode plate having one end connected to the vibration beam;

plate-like second and third electrode plates disposed parallel with the surface of the silicon single crystal substrate so as to be opposed to each other with the vibration beam interposed in between; and asperities formed on confronting side surfaces of the vibration beam and the second and third electrode plates, wherein the vibration beam, and the first, second and third electrode plates are located in one flat-plate-like space extending parallel with the surface of the silicon single crystal substrate.

A vibration transducer according to a second aspect of the invention, in the vibration transducer of the first aspect, the asperities on each surface are formed in a streaky structure or in lattice form so as to be continuous in one or both of directions that are parallel with and perpendicular to the surface of the silicon single crystal substrate, respectively.

A vibration transducer according to a third aspect of the invention, in the vibration transducer of the first or second aspect, the second electrode plate is used as an excitation electrode configured to excite the vibration beam and the third electrode plate is used as a vibration detection electrode configured to detect vibration of the vibration beam.

A vibration transducer according to a fourth aspect of the invention, in the vibration transducer of the first or second aspect, the fast electrode plate is used as an excitation electrode configured to excite the vibration beam and the second or third electrode plate is used a as bias electrode configured to apply a DC bias voltage to the vibration beam and a vibration detection electrode configured to detect vibration of the vibration beam.

A vibration transducer according to a fifth aspect of the invention, in the vibration transducer of the first or second aspect, a plurality of the second electrode plates and a plurality of the third electrode plates are disposed on two respective sides of an axis of the vibration beam, and part of the plurality of second electrode plates are used as excitation electrodes and the other second electrode plates are used as detection electrodes, and part of the plurality of third electrode plates are used as detection electrodes and the other third electrode plates are used as excitation electrodes so that a vibration mode of the vibration beam is selected.

A vibration transducer according to a sixth aspect of the invention, in the vibration transducer of any one of the first to fifth aspects, the vibration beam is a double-end-fixed beam.

A manufacturing method of a vibration transducer according to a seventh aspect of the invention, comprises:

(1) forming a silicon layer having a high boron or phosphorus concentration on an SOI substrate;

(2) performing patterning and etching to form trenches in the silicon layer and thereby form a vibration beam and electrodes and also to form asperities on confronting side surfaces of the vibration beam and the electrodes during the same process;

(3) forming an insulating film on the silicon layer and the trenches and thereby closing top portions of the trenches;

(4) forming a first polysilicon layer on the insulating film;

(5) forming an opening in the first polysilicon layer by etching;

(6) forming an oxide film on the first polysilicon layer and in the opening and patterning the oxide film to leave only a portion located in and around the opening;

(7) forming a second polysilicon layer on the first polysilicon layer so as to fill in the opening;

(8) forming holes or slits in a portion, located above the oxide film and the vibration beam, of the second polysilicon layer with the oxide film serving as a stopper;

(9) removing the oxide film and a portion, around the vibration beam, of the insulating film by etching;

(10) forming a third polysilicon layer on the second polysilicon layer and in the holes or slits to seal the vibration beam in a vacuum;

(11) forming holes to reach the respective electrodes by etching the first, second, and third polysilicon layers with the insulating film as a stopper;

(12) forming contact holes for contact to the electrodes in the insulating film; and

(13) forming electrode pads by forming an aluminum layer on the surface and in the contact holes and patterning it.

The first and second aspects of the invention provide the following advantages.

A manufacturing process of the related-art vibration transducer of FIG. 28 requires many processing steps because the vibration beam, the excitation electrode, and the vibration detection electrode are stacked. In contrast, in the vibration transducers according to the first and second aspects of the invention, since the vibration beam, the excitation electrode, and the vibration detection electrode are located in the same flat-plate-like space, the vibration beam, the excitation electrode, and the vibration detection electrode can be formed by a single step (using a single mask).

In the related-art vibration transducer of FIG. 28, it is difficult to roughen the surface of the vibration beam and the surface facing it as a countermeasure against sticking. In contrast, in horizontal vibration type vibration transducers in which the vibration beam, the excitation electrode, and the vibration detection electrode can be located in the same flat-plate-like space, the confronting surfaces can be roughened in the same process as the vibration beam and the electrodes facing it are formed. Therefore, sticking of the vibration beam can be prevented easily and reliably.

For example, the confronting surfaces are roughened by utilizing scallops that are formed by etching in forming the vibration beam and the electrodes or using a mask pattern having projections and recesses in forming the vibration beam and the electrodes.

Since the vibration beam is tong and narrow, the shell width can be made shorter than in the related-art vibration transducer of FIG. 28. Where the shell thickness remains the same, the withstanding pressure can be made higher than in the related-art vibration transducer of FIG. 28.

Where the same withstanding pressure should be obtained, the shell which is a pressure partition can be made thinner than in the related-art vibration transducer of FIG. 28. In vertical vibration type (stack type) vibration transducers such as the related-art vibration transducer of FIG. 28, the drive electrode needs to be formed on the shell side. When high pressure is applied, the shell may be deformed to vary the distance between the drive electrode and the vibration beam and render the frequency variation characteristic nonlinear.

The aspect ratio of the vibration beam also influences the resonance frequencies of horizontal vibration and vertical vibration. If the resonance frequency of the vibration beam vibration mode which is used for pressure measurement interferes with that of another vibration mode, the two resonance frequencies are locked in to cause hysteresis in frequency measurement, resulting in an error. To prevent this problem, it is necessary that the horizontal vibration mode for measurement of the vibration beam have a lowest frequency (first-order mode) and the vertical vibration mode be a high-order mode (third order or higher).

To realize such a state, the vibration beam should be at least three times as long in the vertical direction as in the horizontal direction. The vibration beam having a long and narrow shape in the vertical direction is important to increase the measurement accuracy.

Furthermore, since the vibration beam can be shaped freely in two dimensions, a vibration beam having a complex shape and a vibration beam having an effect of increasing vibration stability can be formed easily.

The third aspect of the invention provides the following advantage. Since the excitation electrode and the detection electrode are distant from each other, crosstalk which is a phenomenon that an excitation signal goes into a detection circuit is suppressed and the SN ratio is thereby increased.

The fourth aspect of the invention provides the following advantage. A vibration transducer can be obtained which has only a small number of electrodes and is simple in configuration.

The fifth aspect of the invention provides the following advantage. The vibration beam can be excited so as to select a desired vibration mode.

The sixth aspect of the invention provides the following advantage. A vibration transducer can be obtained which can perform pressure measurement in a wide dynamic range because it is capable of self-oscillation with a double-end-fixed beam having a smallest number of vibration modes and hence it is free of mode crossing in a measurement range and can be used in a wide frequency bandwidth.

The seventh aspect of the invention provides the following advantage. A manufacturing method can be obtained which can manufacture a vibration transducer in which a vibration beam, an excitation electrode, and a vibration detection electrode are located in the same flat-plate-like space.

DETAILED DESCRIPTION

Embodiments of the present invention will be hereinafter described in detail with reference to the drawings.

Figure 1A:
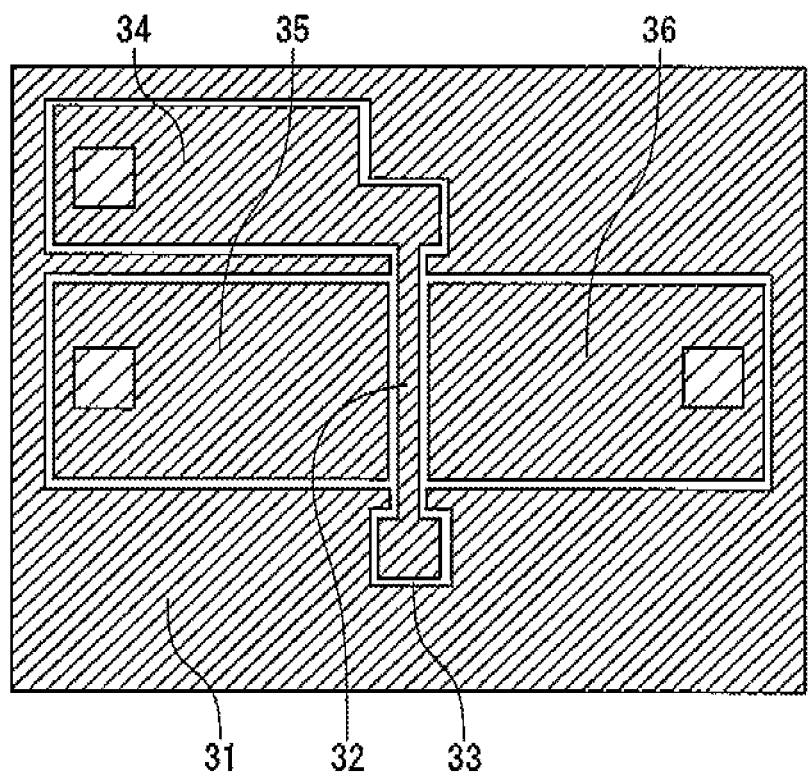
FIGS. 1A and 1B illustrate an important part of a vibration transducer according to an embodiment of the invention.

FIGS. 1-15 illustrate an important part of a vibration transducer according to an embodiment of the invention. FIGS. 1A and 13 are a plan view and a sectional view, respectively, showing the configuration of an important part of a vibration transducer assembly. FIGS. 2-15 illustrate a manufacturing process. Only members that are different than in FIG. 28 will be described below.

Figure 1B:
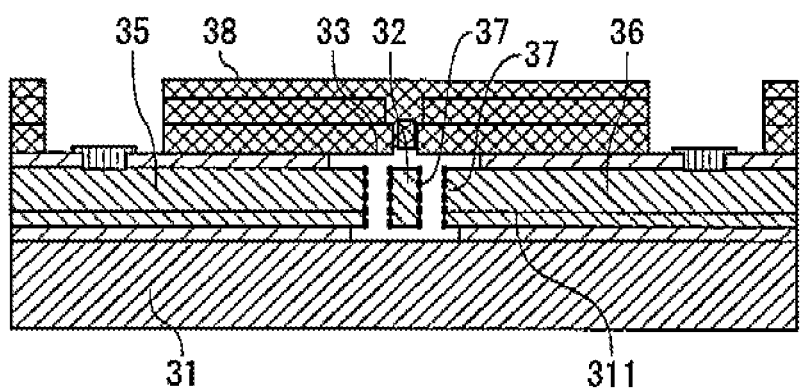

As shown in FIGS. 1A and 1B, a vibration beam 32 is disposed in a vacuum room 33 and tensile stress is exerted on a substrate 31. The vibration beam 32 is a silicon single crystal having a sectional shape that it is longer in the direction that is perpendicular to a surface 311 of a substrate 31 than in the direction that is parallel with the surface 311.

A first electrode plate 34 is shaped like a plate and disposed parallel with the surface 311 of the substrate 31. One end of the first electrode plate 34 is connected to the vibration beam 32.

A second electrode plate 35 and a third electrode plate 36 are shaped like a plate and disposed parallel with the surface 311 of the substrate 31 so as to be opposed to each other with the vibration beam 32 imposed in between. The second electrode plate 35 and the third electrode plate 36 are located in the same flat-plate-like space extending parallel with the surface 311 of the substrate 31 as the vibration beam 32 and the first electrode plate 34 are.

Asperities 37 are formed on the confronting side surfaces of the vibration beam 32, the second electrode plate 35, and the third electrode plate 36 and prevent them from sticking to each other.

On each surface, the asperities 37 are formed in a streaky structure or in lattice form so as to be continuous in one or both of the directions that are parallel with and perpendicular to the surface 311 of the substrate 31, respectively. The asperities 37 will be described later in detail. Reference numeral 38 denotes a shell.

Next, a manufacturing process of the vibration transducer of FIGS. 1A and 1B will be described.

Figure 2:
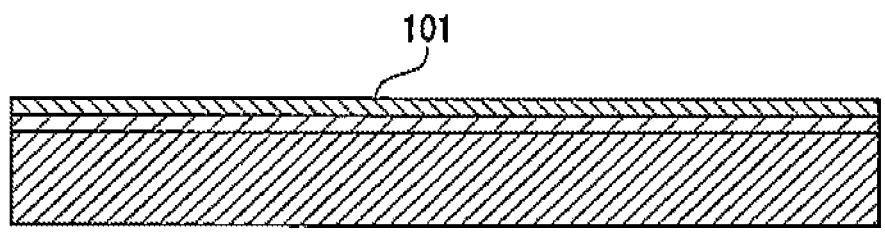
FIGS. 2-15 illustrate a manufacturing process of FIG. 1.

First, as shown in FIG. 2, an SOI substrate 101 is prepared. For example, an SOI substrate 101 having a 2-μm-thick buried oxide film (BOX layer) and a 1-μm-thick silicon layer (device layer) is used.

Figure 3:
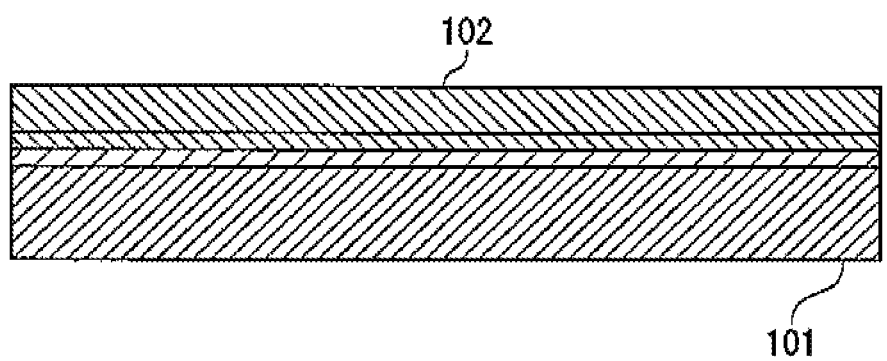

Then, as shown in FIG. 3, a silicon layer 102 having a high boron (B) concentration is grown epitaxially on the device layer of the SOI substrate 101 in an epitaxial growth system. Having a high boron concentration, the silicon layer 102 is low in resistivity and hence is a conductor. Thus, a vibration beam, electrodes will be formed from the silicon layer 102.

Higher tensile stress remains in the silicon layer 102 having a high boron concentration than in the substrate 101, and hence tension will occur in a vibration beam.

When tensile stress is applied to a vibration beam, the square of the frequency varies linearly with the stress as is understood from Formula 1 and a characteristic that is very high in linearity is obtained. On the other hand, in a compressive stress range, the vibration beam exhibits a characteristic that is high in nonlinearity. Therefore, vibration transducers should operate in a tensile stress range.

The growth conditions of the silicon layer 102 having a high boron concentration are as follows.

A 9-μm-thick silicon layer 102 having a high boron concentration is grown by performing epitaxial growth for a prescribed time at a growth temperature 1,030° C. in an $H_2$ gas using dichlorosilane ($SiH_2Cl_2$) as a silicon material gas and diborane ($B_2H_6$) as a material gas of boron (impurity). The total thickness of the device layer and the silicon layer 102 is thus 10 μm.

Figure 4:
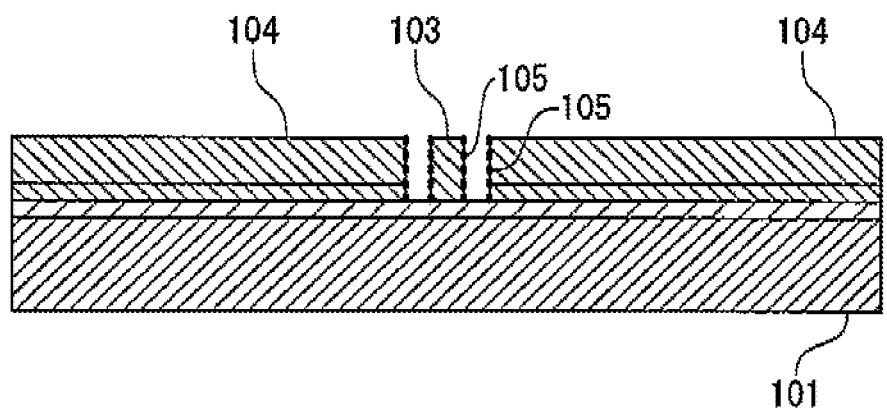

Then, as shown in FIG. 4, a resist is applied to the surface of the silicon layer 102 having a high boron concentration and then patterned using a stepper, which has a resolution of about 0.3 μm and is capable of submicron line-and-space exposure. A vibration beam 103 is outlined and electrodes 104 are patterned using the stepper.

The silicon layer 102 and the device layer are etched by 10 μm to form trenches using a dry etching system. In doing so, a silicon etching process and a CF polymer deposition process are performed repeatedly, what is "Bosch process", whereby crease-shaped asperities 105 are formed on each of the side surfaces of the trenches formed.

Stripes extending in the horizontal direction are formed so as to have a height of about 0.1 μm or more and a pitch of about 0.1 to 1 μm by adjusting the etching time and the deposition time. The etching is performed until the BOX layer is reached and the vibration beam 103 and the electrodes 104 are separated from each other.

Figure 5:
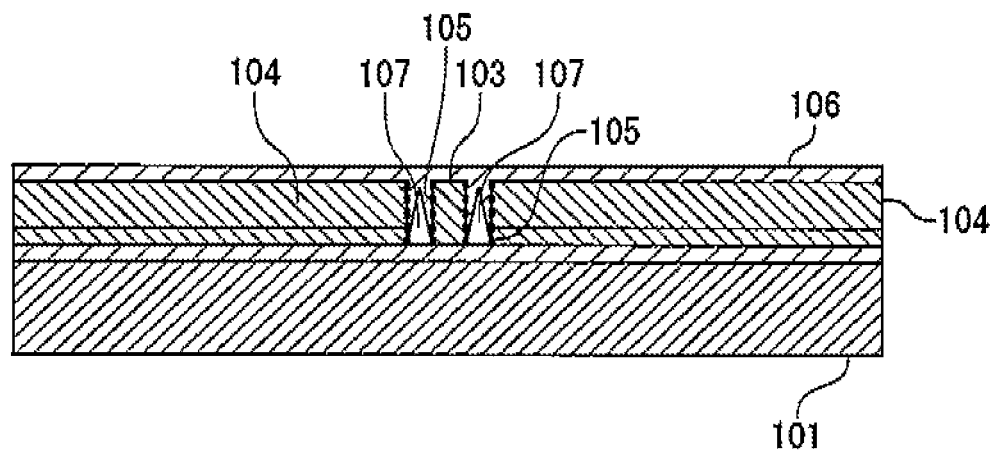

Then, as shown in FIG. 5, after the CF polymer is removed and the resist is peeled off, an insulating film 106 is formed so as to go into the grooves which were formed at the step of FIG. 4. More specifically, the opening portions of the trenches are closed by an oxide film 104 formed by LP-CVD, plasma CVD, or the like using tetraethoxysilane (TEOS).

An LP-CVD oxide film (silicon oxide coating) 106 is formed on the silicon substrate through thermal decomposition of TEOS in a vacuum at a temperature 700° C. and a pressure 50 Pa by introducing a nitrogen ($N_2$) gas and an oxygen gas that are mixed with TEOS by causing bubbling in a TEOS tank.

A plasma CVD film (silicon oxide coating) 106 is formed on the silicon substrate placed on a stage that is heated to 400° C. by generating plasma in a vacuum by introducing TEOS and an oxygen gas. Since a plasma CVD system is low in step coverage, the oxide film 106 is not apt to be formed in deepest portions of the trenches and hence voids 107 are formed in the respective trenches.

Figure 6:
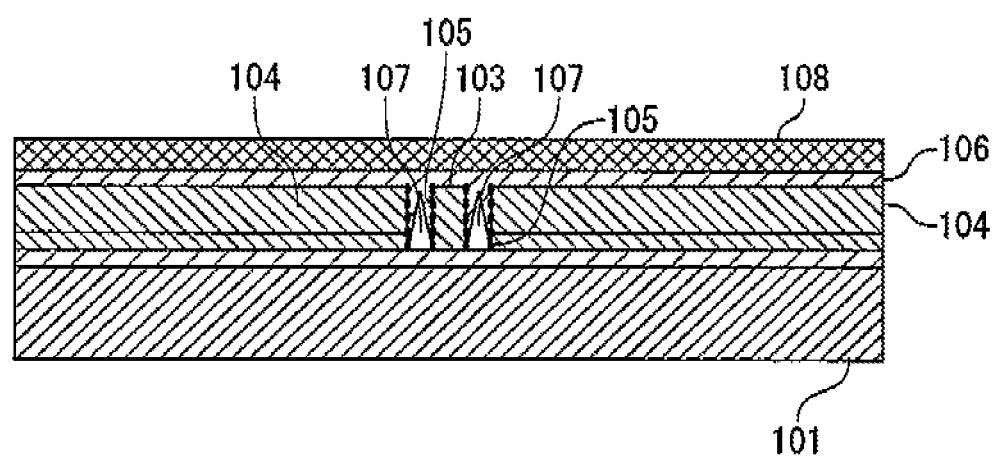

Then, as shown in FIG. 6, a polysilicon film 108 of several micrometers in thickness is formed on the oxide film 106 which closes the top portions of the trenches. The polysilicon film 108 serves to form a vacuum room 33 for keeping the vibration beam 103 confined in a vacuum and isolating it from silicone oil which transmits pressure.

Figure 7:
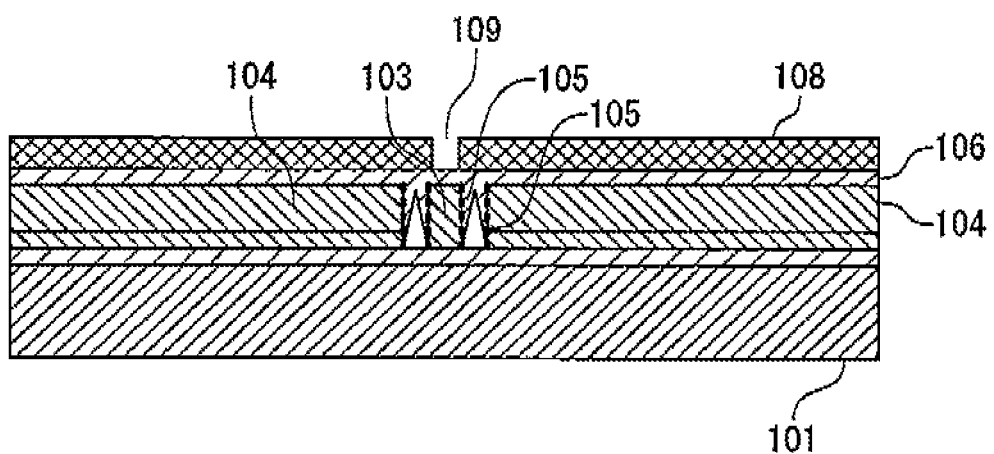

Then, as shown in FIG. 7, an opening 109 is formed through the thus-formed polysilicon film 108 by dry etching.

Figure 8:
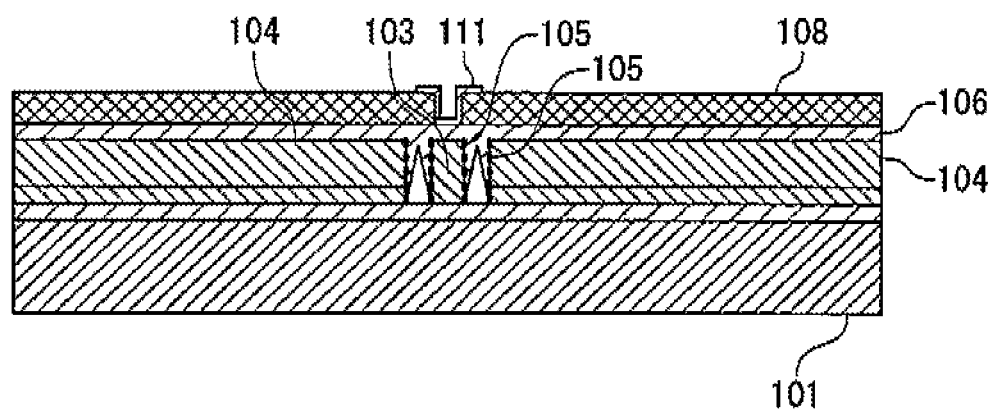

Then, as shown in FIG. 8, a silicon oxide film 111 of about 100 nm in thickness is formed by LP-CVD and then patterned by buffered hydrofluoric acid so as to be left only around the opening 109. The silicon oxide coating 111 will later serves to form an introduction gap for an etching liquid or an etching gas in removing a sacrificial layer around the vibration beam 103 through the opening 109.

Figure 9:
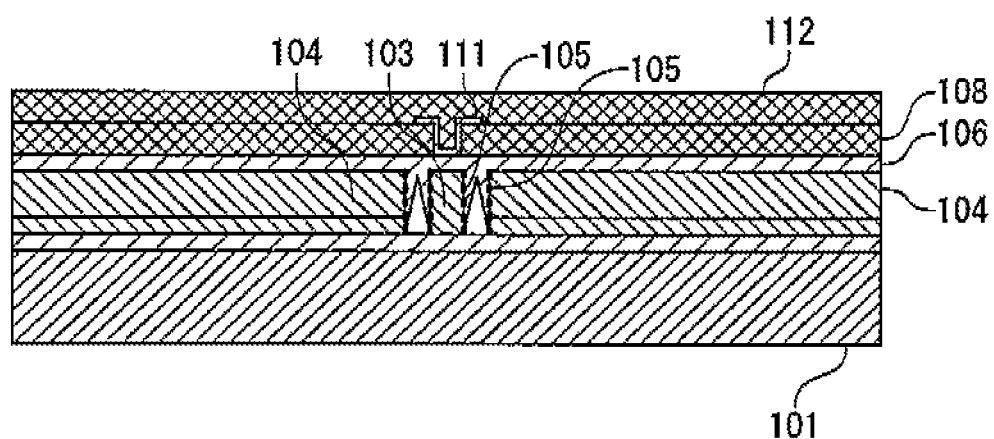

Then, as shown in FIG. 9, a polysilicon layer 112 is formed to fill in the opening 109.

Figure 10:
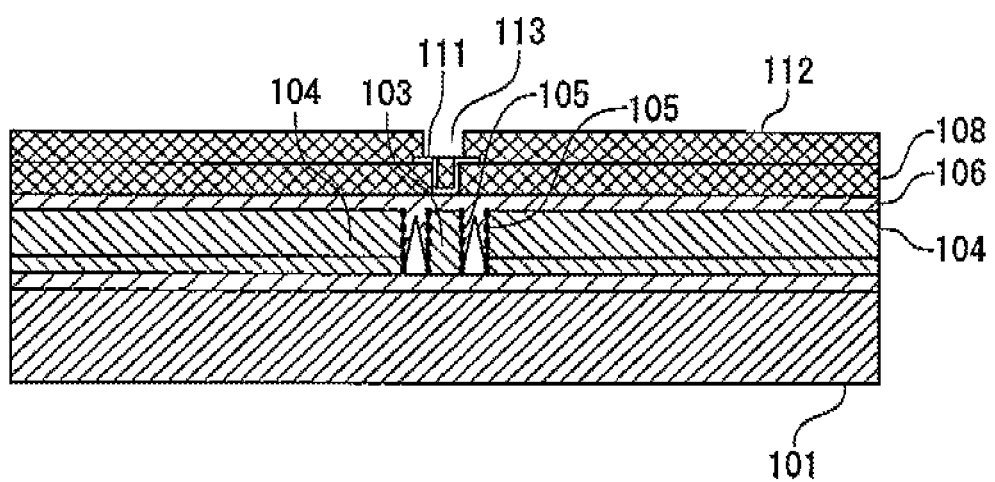

Then, as shown in FIG. 10, a hole or slit 113 is formed through the polysilicon layer 112 over the silicon oxide film 111 which was formed at the step of FIG. 8 (i.e., over the vibration beam 103). The silicon oxide film 111 serves as a stopper.

Figure 11:
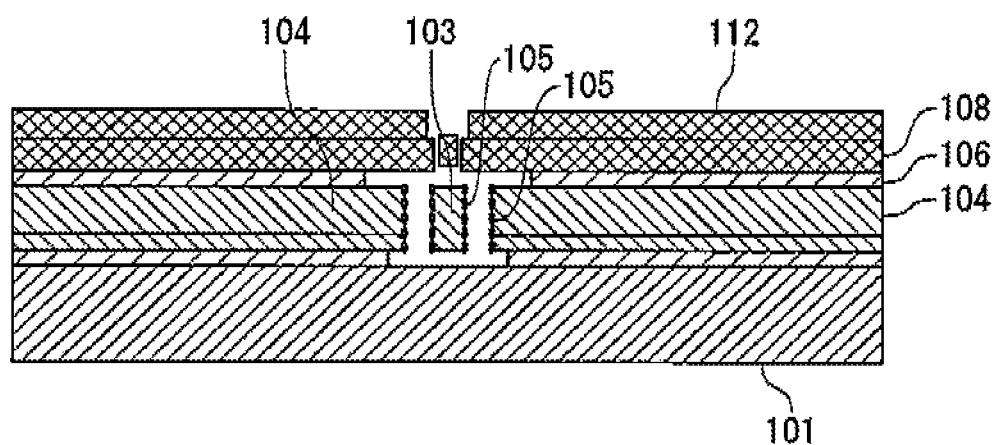

Then, as shown in FIG. 11, a sacrificial layer is removed by etching using an HF gas or a dilute HF liquid.

Figure 12:
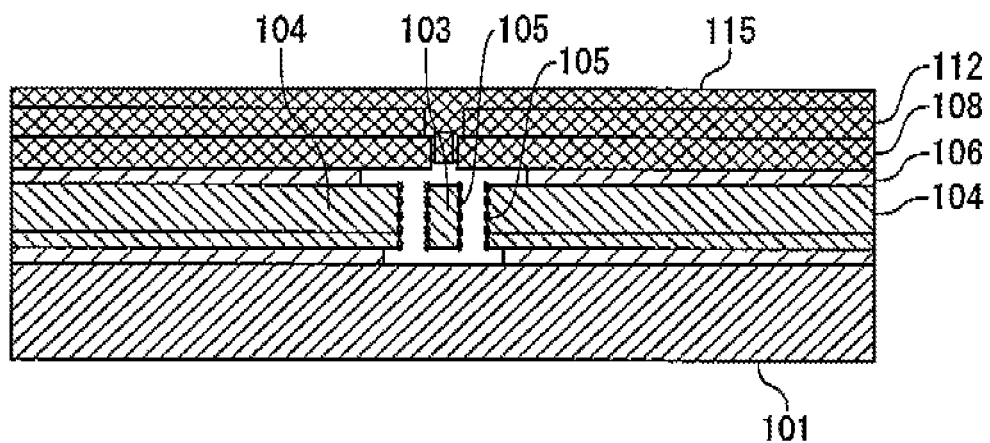
Figure 13:
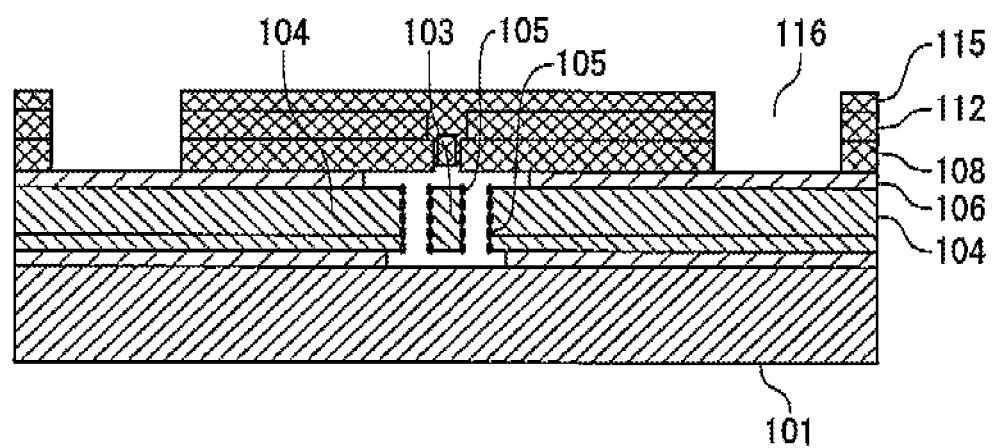

Then, since scallops disappear if they are put in an $H_2$ atmosphere or in a vacuum with the temperature being higher than 900° C., as shown in FIG. 12 vacuum sealing is performed at a low temperature that is lower than 900° C. using a polysilicon film 115 formed by LP-CVD. For example, the polysilicon film 115 is formed in a vacuum using an $SiH_4$ gas at a temperature 590° C. and a pressure 85 Pa.

The polysilicon film 115 is formed under such conditions that tensile strain remains or almost no compressive strain remains. $SiH_4$ or a mixture of $SiH_4$ and hydrogen is used as a silicon material gas.

Then, as shown in FIG. 13, holes 116 to reach the electrodes 104 are formed through the polysilicon films 108, 112, and 115 which serve to form the vacuum room by reactive ion etching (RIE) with the underlying oxide film 106 as a stopper.

Figure 14:
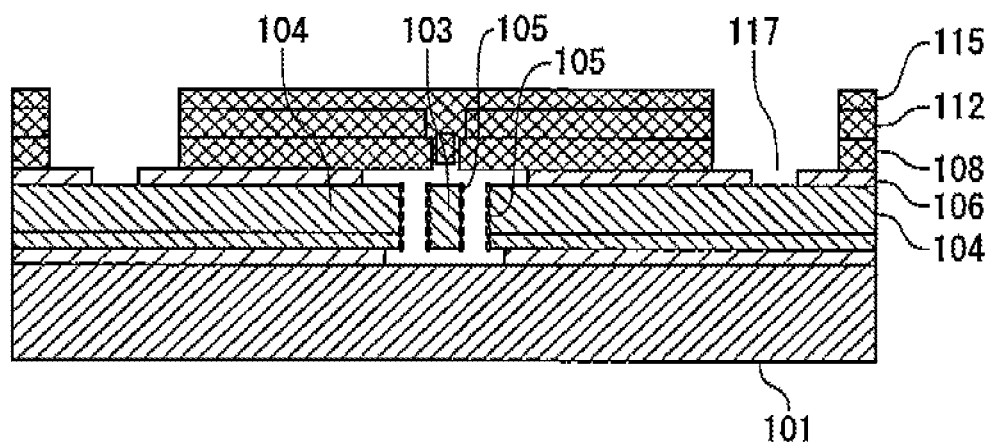

Then, as shown in FIG. 14, contact holes 117 for contact to the electrodes 104 are formed through the oxide film 106.

Figure 15:
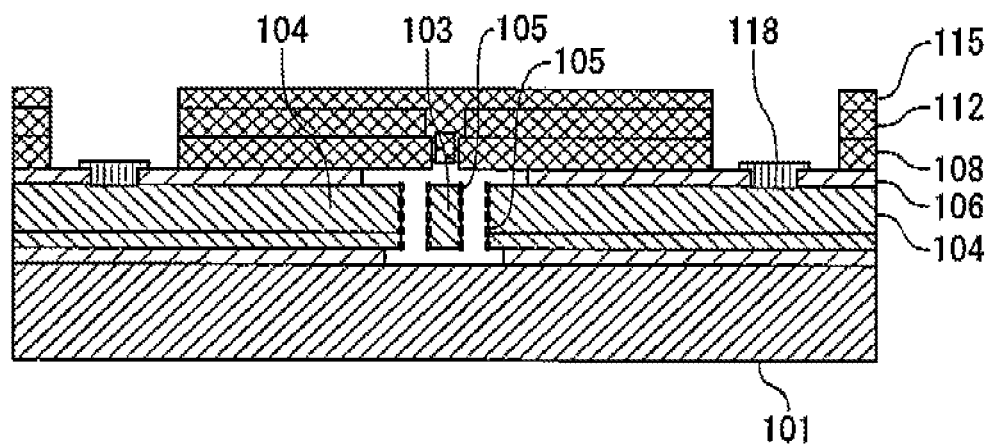

Then, as shown in FIG. 15, an aluminum (Al) film is formed by evaporation or sputtering and then patterned to form electrode pads 118. The electrode pads 118 are connected to an external driver circuit by gold wire bonding.

With the above configuration, basically, the vibration beam 32 is driven by generating electrostatic attractive force F by applying a bias voltage Vb and a drive voltage Vi between the vibration beam 32 and one of the confronting electrodes.

As for the detection method, charge Q=CV is stored in the capacitor that is formed by the vibration beam 32 and the other electrode by DC-biasing it. When the vibration beam 32 is vibrated and its capacitance C is thereby varied, the stored charge Q is varied and a corresponding AC voltage is generated. The generated AC voltage is amplified by a differential amplifier or the like and a resulting voltage variation is read by a counter. A vibration frequency of the vibration beam 32 is thus measured.

Figure 16:
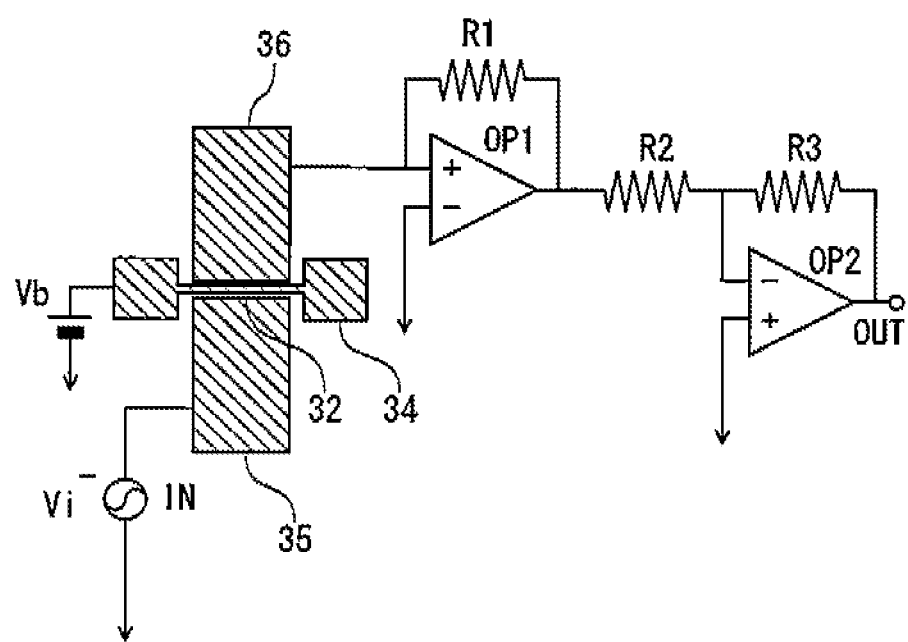
FIG. 16 shows a specific circuit diagram of FIG. 1.

FIG. 16 shows a specific circuit diagram of a vibration transducer according to the invention. In FIG. 16, reference numeral Vb denotes a bias voltage (constant voltage); Vi, a drive voltage (AV voltage); R1-R3, resistors; and OP1 and OP2, operational amplifiers. The bias voltage Vb is applied to the first electrode 34 and the drive voltage Vi is applied to the second electrode 35. A signal representing a vibration frequency of the vibration beam 32 is taken out from the third electrode 36. That is, the second electrode 35 and the third electrode 36 are used as an excitation electrode and a detection electrode, respectively.

Since the excitation electrode and the detection electrode are distant from each other, the parasitic capacitance between them is reduced, whereby crosstalk is suppressed which is a phenomenon that part of an excitation signal goes into the detection circuit side. The vibration transducer is thus given a large SN ratio.

Figure 17:
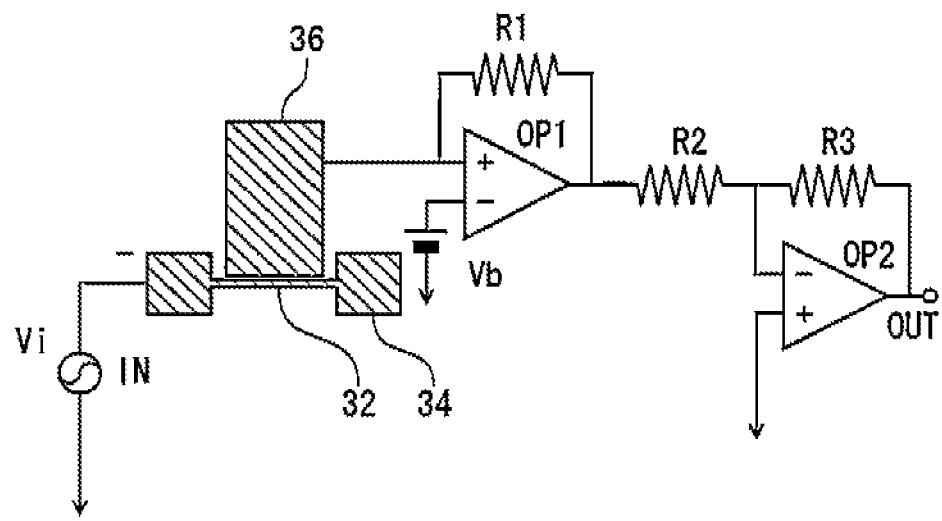
FIG. 17 shows another specific circuit diagram of FIG. 1.

FIG. 17 shows a specific circuit diagram of another vibration transducer according to the embodiment. In FIG. 17, reference numeral Vb denotes a bias voltage (constant voltage); Vi, a drive voltage (AV voltage); R1-R3, resistors; and OP1 and OP2, operational amplifiers. The bias voltage Vb is applied to the third electrode 36 and the drive voltage Vi is applied to the first electrode 34. A signal representing a vibration frequency of the vibration beam 32 is taken out from the third electrode 36.

Being small in the number of electrodes and simple in configuration, this vibration transducer is inexpensive. However, this vibration transducer is prone to crosstalk which is a phenomenon that part of an excitation signal goes into the detection circuit side. Thus, the SN ratio may become small.

Figure 18A:
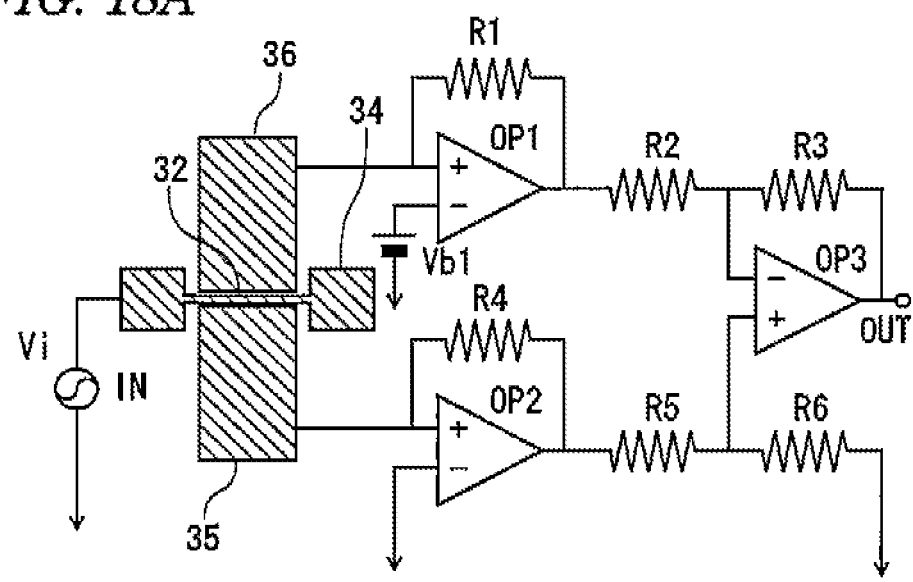
FIGS. 18A and 18B show another specific circuit diagram of FIG. 1.
Figure 18B:
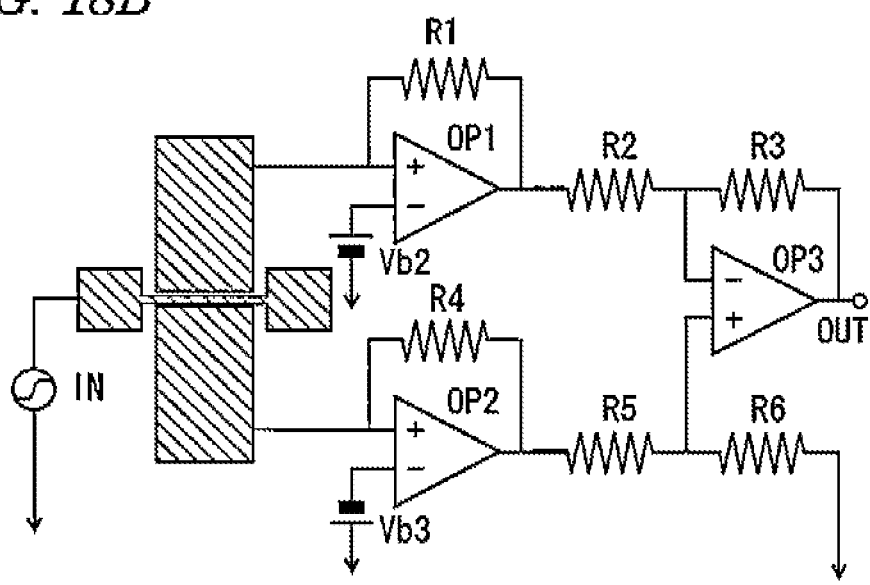

FIGS. 18A and 18B are specific circuit diagrams of important parts of other vibration transducers according to the invention. In FIGS. 18A and 18B, reference numerals Vb1 and Vb2 denote bias voltages (constant voltages); Vi, a drive voltage (AV voltage); R1-R6, resistors; and OP1 and OP2, operational amplifiers.

The drive voltage Vi is applied to the first electrode 34, and a signal representing a vibration frequency of the vibration beam 32 is taken out from the second electrode 35 and the third electrode 36. The bias voltage Vb2 shown in FIG. 18B is a negative voltage having the same absolute value as the bias voltage Vb1 which is a prescribed positive voltage.

Crosstalk levels can be canceled out each other by differential signal processing between outputs from the two electrodes 35 and 36, whereby the SN ratio can be increased.

Figure 19:
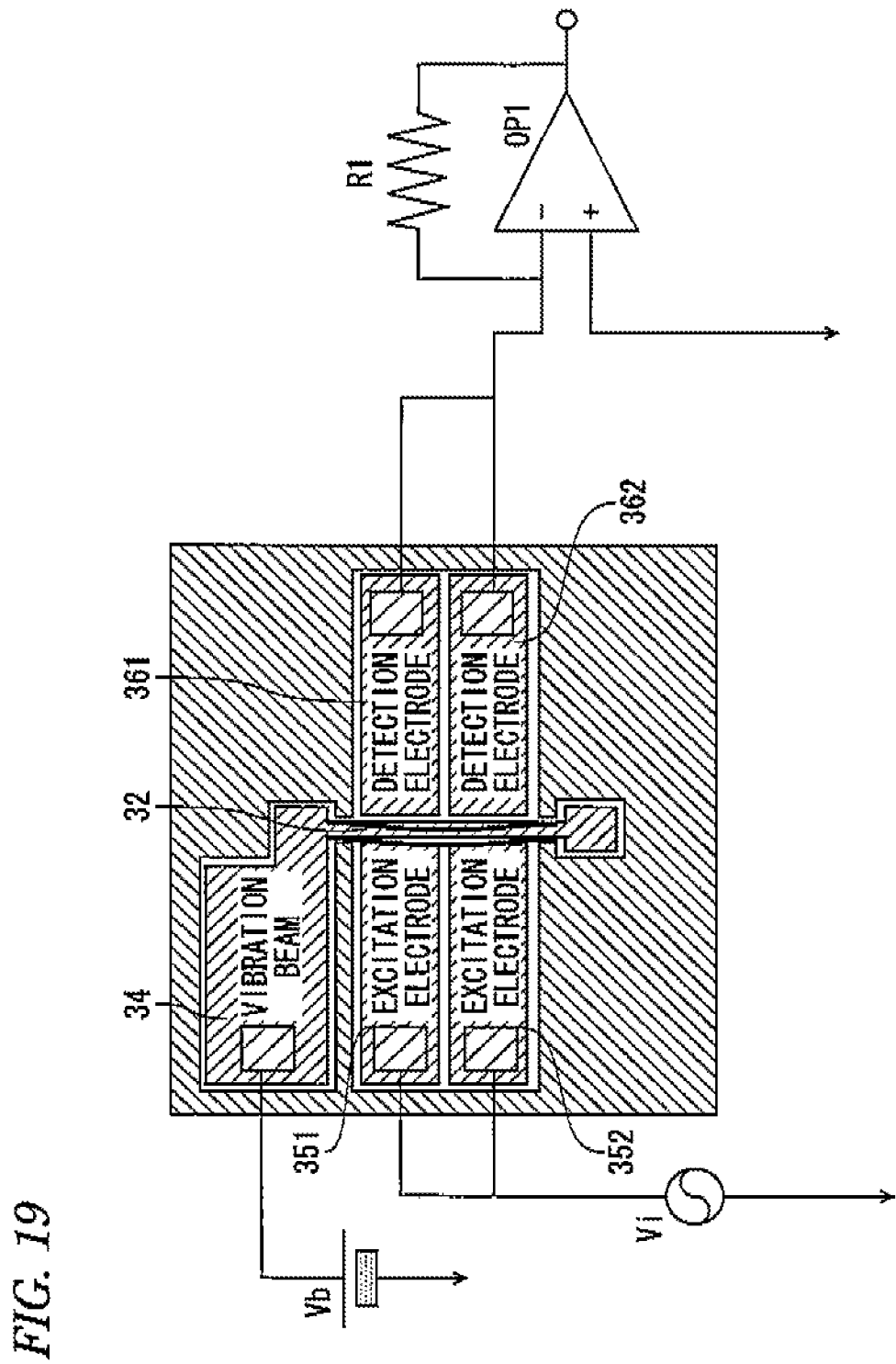
FIG. 19 shows another specific circuit diagram of FIG. 1.
Figure 20:
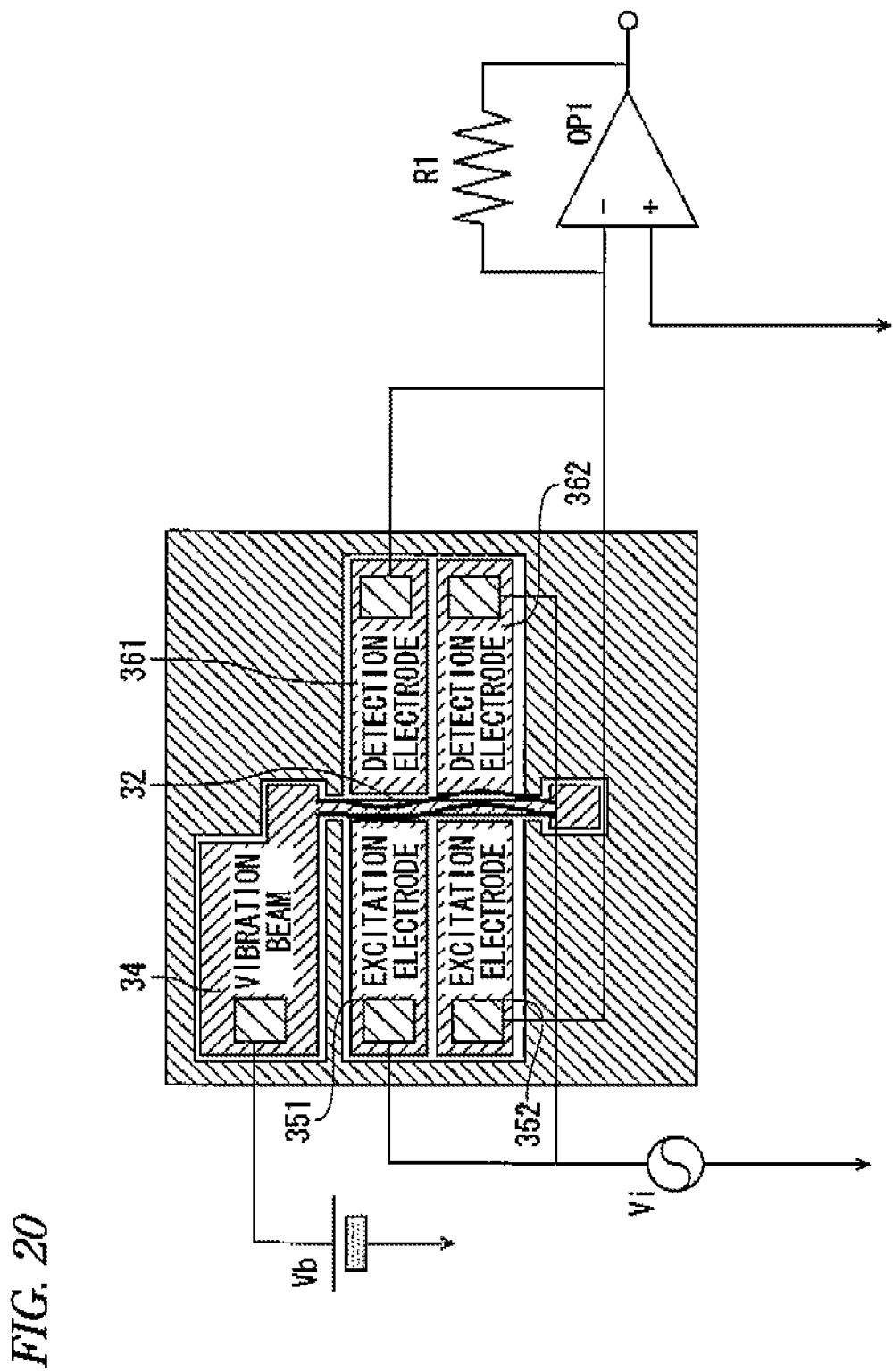
FIG. 20 shows another specific circuit diagram of FIG. 1.

FIGS. 19 and 20 are specific circuit diagrams of important parts of further vibration transducers according to the invention. In FIGS. 19 and 20, reference numeral Vb denotes a bias voltage (constant voltage); Vi, a drive voltage (AV voltage); R1, a resistor; and OP1, an operational amplifier.

The bias voltage Vb is applied to the first electrode 34. Plural second electrodes 35 and plural third electrodes 36 are provided. A vibration mode of the vibration beam 32 can be selected by selecting an excitation electrode(s) and a detection electrode(s) from the second electrodes 35 and the third electrodes 36. The examples of FIGS. 19 and 20 are of a five terminal type in which two second electrodes 351 and 352 and two third electrodes 361 and 362 are arranged on the two sides of the vibration beam 32.

In the example of FIG. 19, a pair of excitation electrodes and a pair of detection electrodes are disposed on the respective sides of the vibration beam 32. In this case, vibration of a first-order mode is generated.

In the example of FIG. 20, the two excitation electrodes are disposed diagonally and the two detection electrodes are also disposed diagonally. In this case, vibration of a second-order mode is generated because forces in opposite directions act on the halves of the vibration beam 32.

In this manner, any of various vibration modes can be obtained selectively by selecting a combination of the number of electrodes and an excitation method.

Next, how to form the asperities 37 will be described in detail. As shown in FIG. 4, the asperities 37 are formed by utilizing scallops that are formed in forming the vibration beam 32 and the side surfaces of the electrodes 34, 35, and 36 by etching or by using a mask pattern having minute projections for etching.

To form scallops, a Bosch process, for example, is used, which is an etching method in which etching and side wall protection are performed repeatedly. The Bosch process enables etching of a large aspect ratio.

As shown in FIGS. 21A-21E, the following two steps are executed repeatedly. Reference numerals 41 and 42 denote a silicon substrate and a mask pattern, respectively.

(1) Etching Step

Figure 21A:
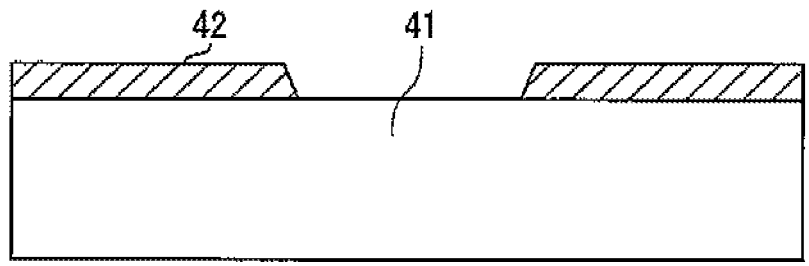
FIGS. 21A to 21E illustrate a process of forming asperities 37 of FIG. 1.
Figure 21B:
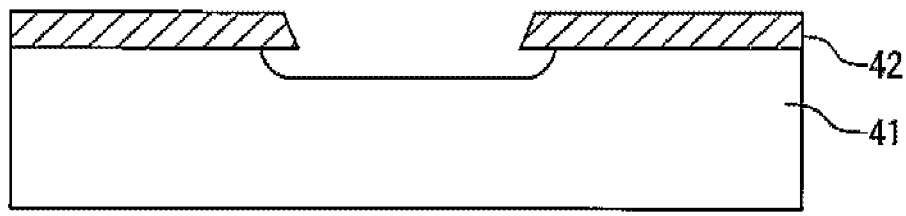
Figure 21C:
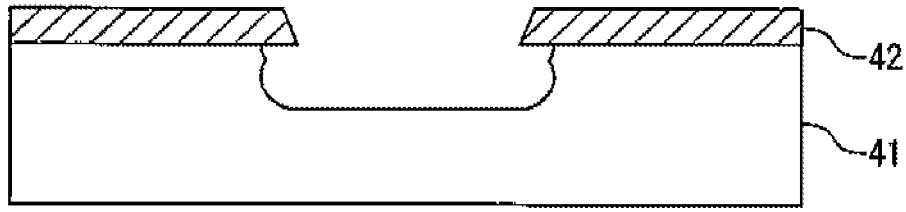
Figure 21D:
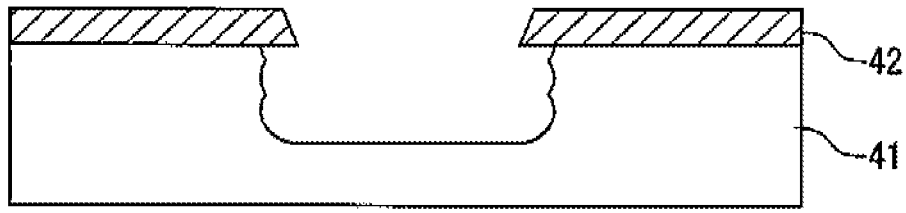

As shown in FIGS. 21B and 21D, isotropic etching is performed using sulfur hexafluoride ($SF_6$). There is a case that a protective film is formed on the bottom surface of an etching hole. This step has a function of removing such a protective film.

(2) Protection Step

Figure 21E:
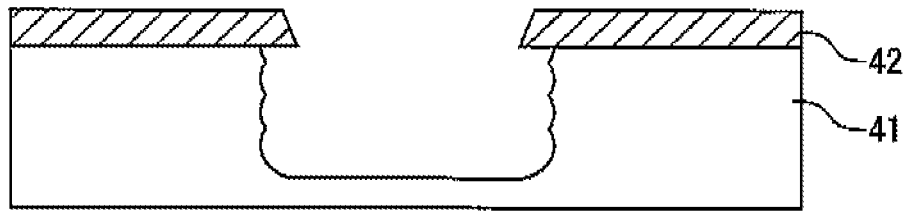

As shown in FIGS. 21C and 21E, lateral etching is suppressed by protecting the side walls by depositing CF-type coatings on the side walls using a flon-type gas (e.g., $C_4F_8$).

Figure 22:
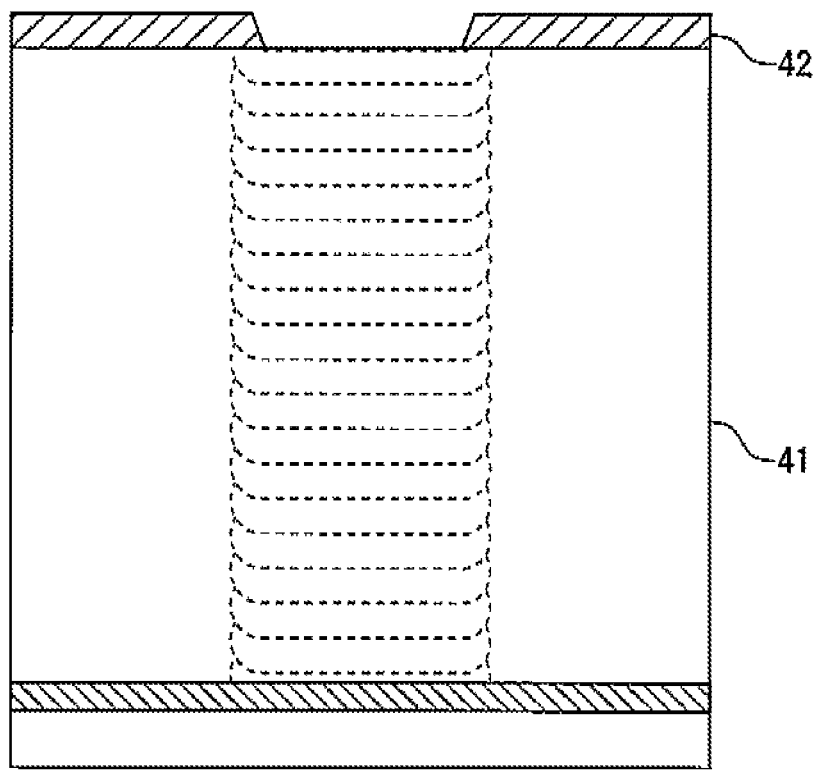
FIG. 22 shows a completed state of the asperities 37 of FIG. 1.
Figure 23:
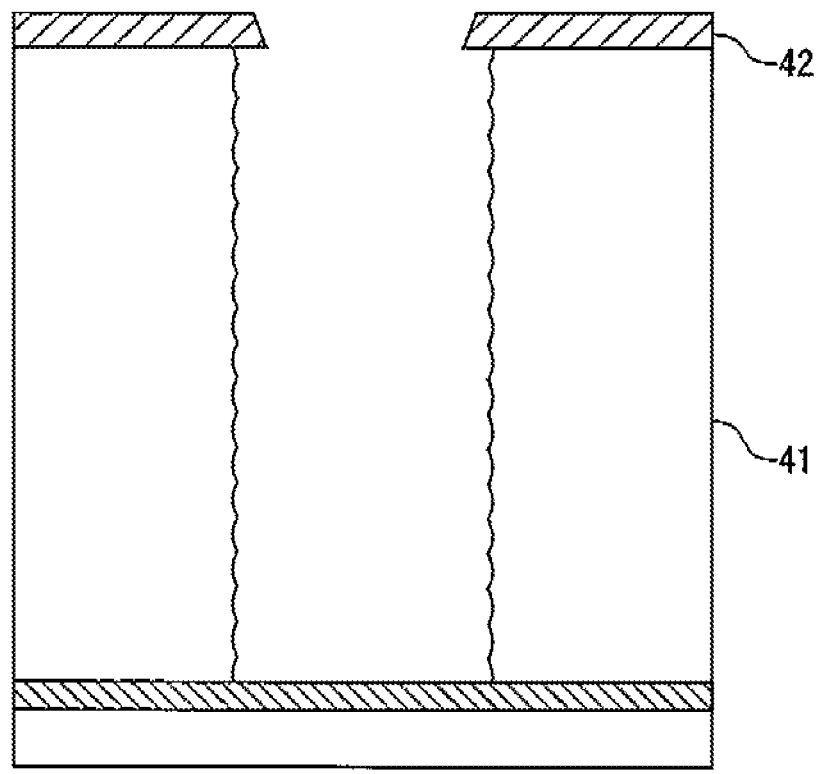
FIG. 23 is a sectional view of FIG. 22.

Fine crease-shaped asperities called a scallop are formed by executing the etching step and the protection step repeatedly. The manner of arrangement of projections and recesses can be controlled by adjusting the durations of the etching step and the protection step. FIG. 22 shows a completed state of the asperities 37 of FIG. 1 and FIG. 23 is a sectional view of FIG. 22.

FIGS. 24A and 24B to FIGS. 26A-26C show examples of the asperities 37 that are formed by utilizing scallops and a mask pattern having minute projections.

Figure 24A:
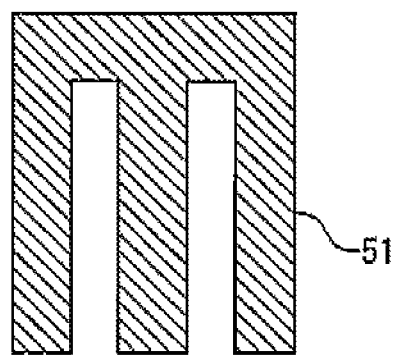
FIGS. 24A to 26C show examples of the asperities 37 of FIG. 1.
Figure 24B:
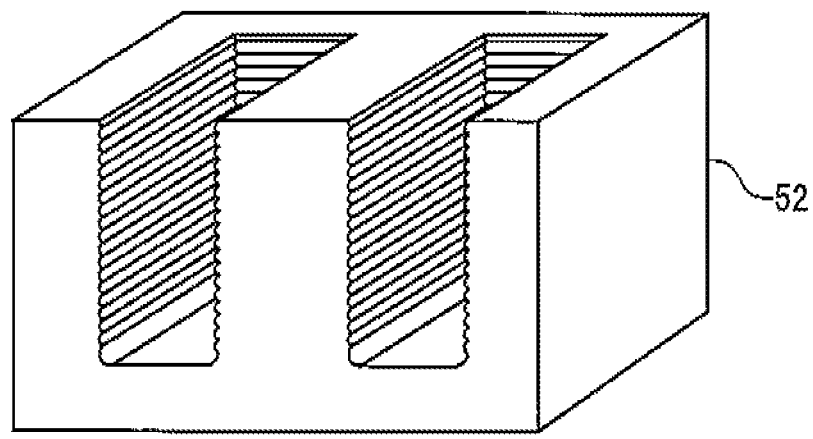

FIG. 24B shows a result of an example process in which scallops are formed in a silicon substrate 52 using a mask pattern 51 shown in FIG. 24A.

Figure 25A:
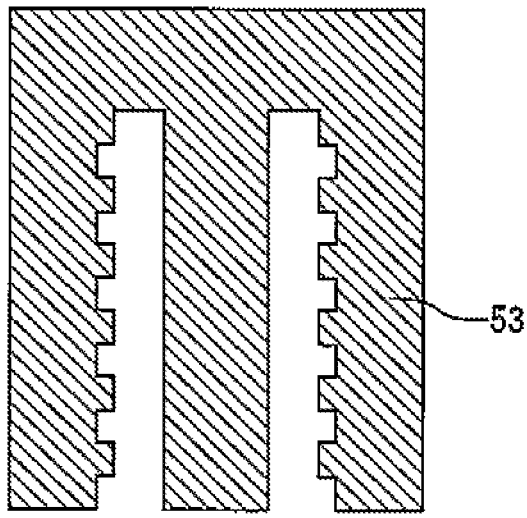
Figure 25B:
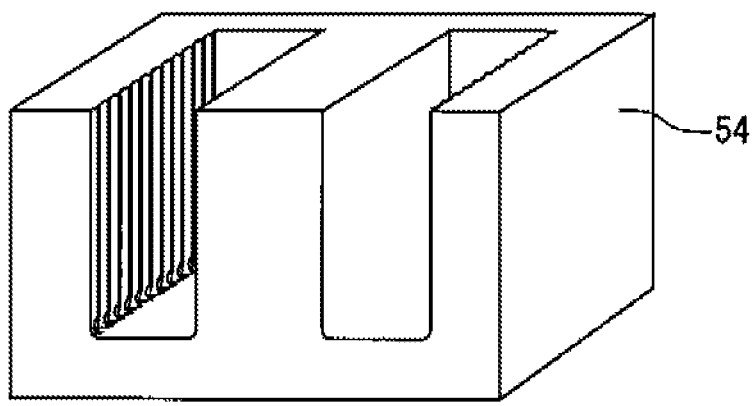

FIG. 25B shows a result of an example process in which ordinary anisotropic etching is performed on a silicon substrate 54 using a mask pattern 53 shown in FIG. 25A.

Figure 25C:
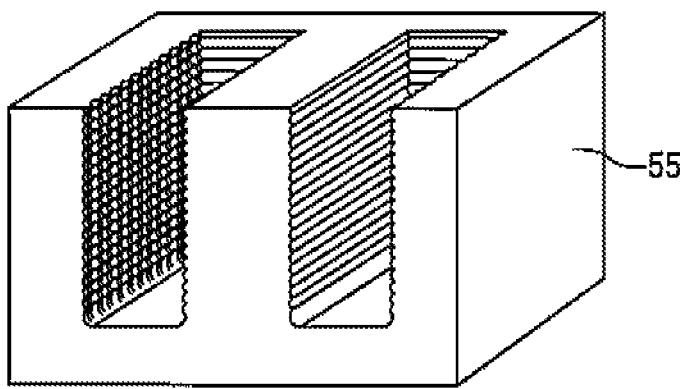

FIG. 25C shows a result of an example process in which scallops are formed in a silicon substrate 55 by a Bosch process using the mask pattern 53 shown in FIG. 25A.

Figure 26A:
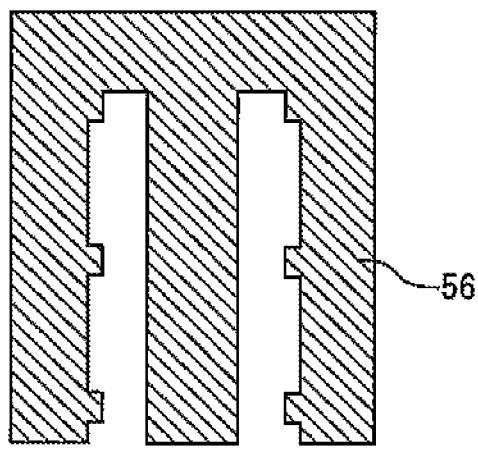
Figure 26B:
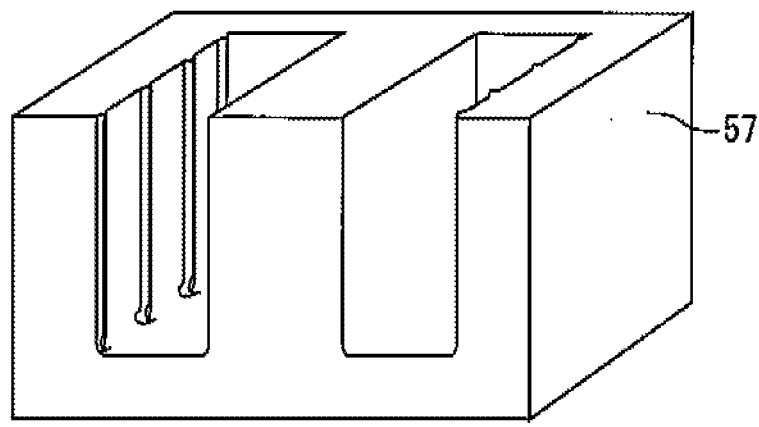

FIG. 26B shows a result of an example process in which ordinary anisotropic etching is performed on a silicon substrate 57 using a mask pattern 56 shown in FIG. 26A.

Figure 26C:
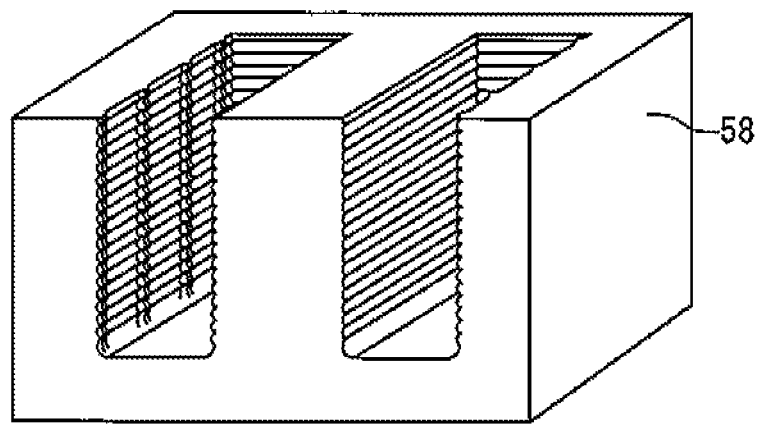

FIG. 26C shows a result of an example process in which scallops are formed in a silicon substrate 58 by a Bosch process using the mask pattern 53 shown in FIG. 26A.

Figure 27A:
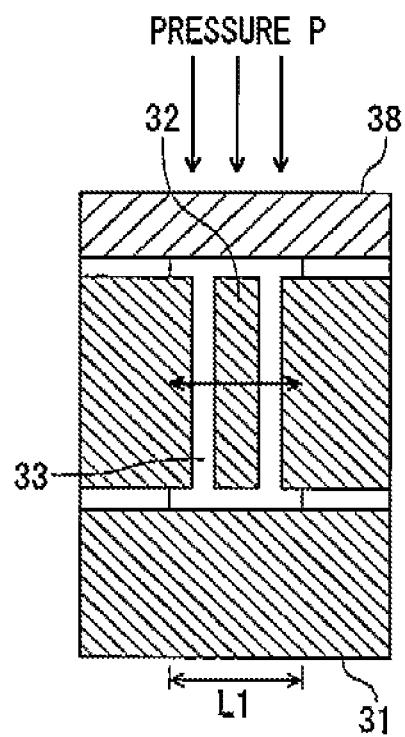
FIG. 27A is a schematic view showing a relationship between a vibration beam and a shell of the embodiment of the invention.
Figure 27B:
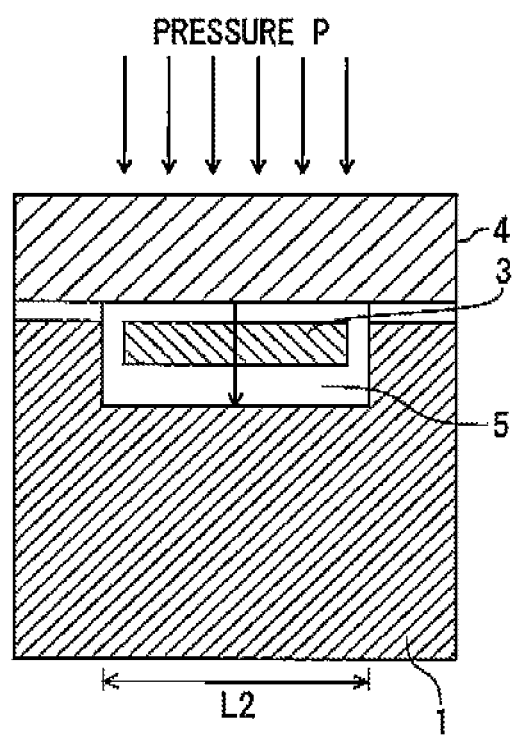
FIG. 27B is a schematic view showing a relationship between the vibration beam and the shell in a related-art vibration transducer shown in FIG. 28.

Next, a description will be made of a relationship between the vibration beam 32 and the shell 38 in the invention. FIG. 27A is a schematic view showing a relationship between the vibration beam 32 and the shell 38 in the invention. FIG. 27B is a schematic view showing a relationship between the vibration beam 3 and the shell 4 in the related-art vibration transducer shown in FIG. 28.

Figure 28:
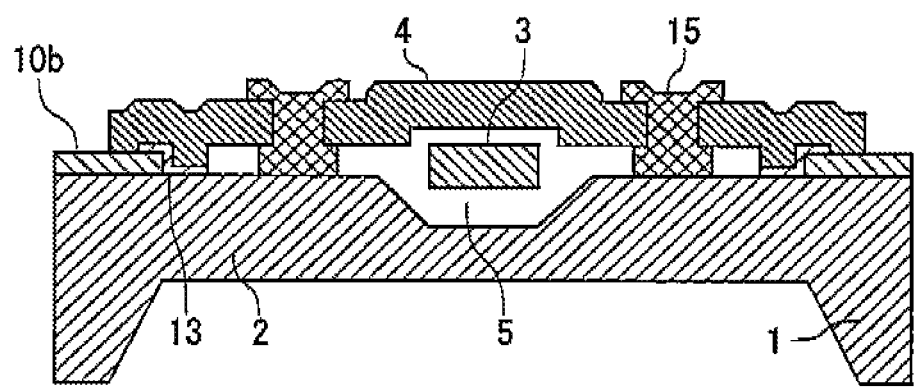
FIG. 28 illustrates an important part of the related-art vibration transducer.
Figure 29:
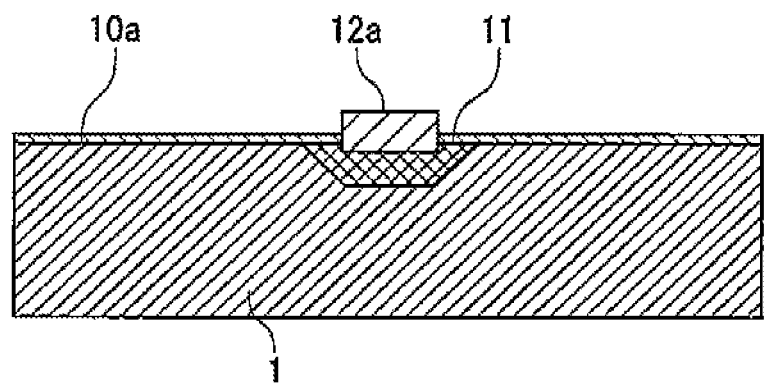
FIGS. 29-37 illustrate a manufacturing process of FIG. 28.
Figure 30:
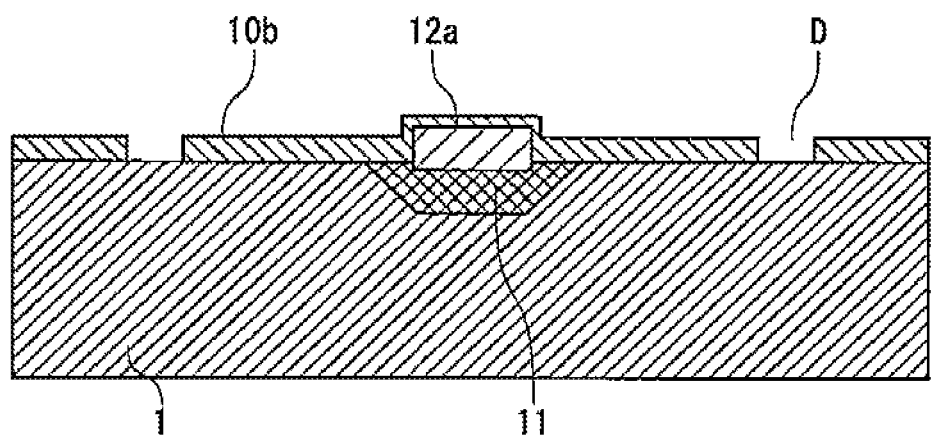
Figure 31:
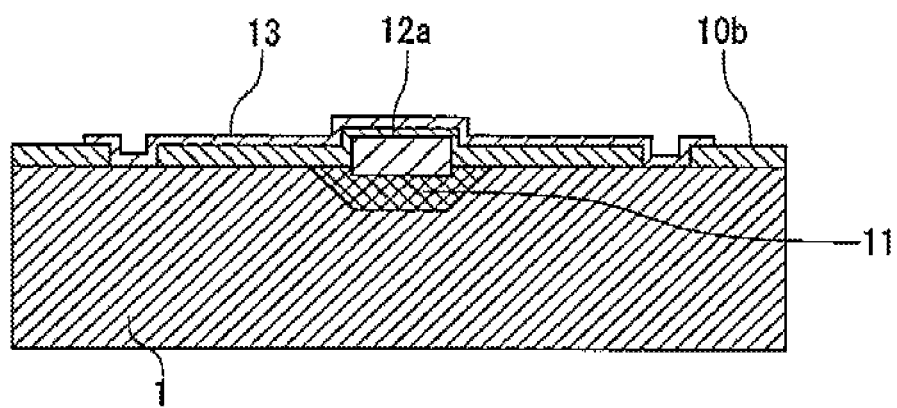
Figure 32:
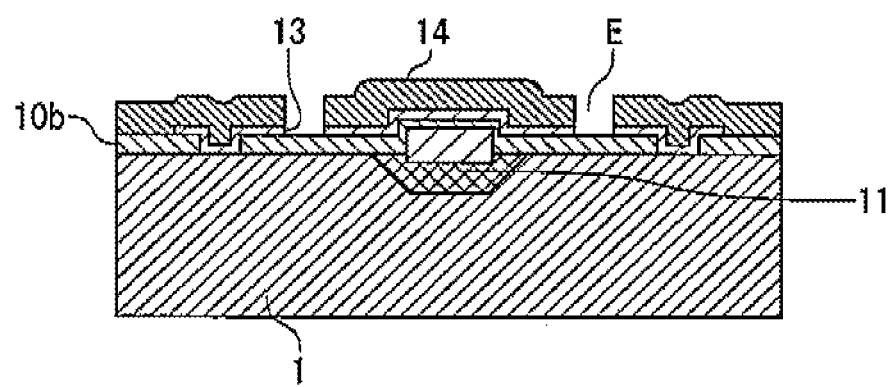
Figure 33:
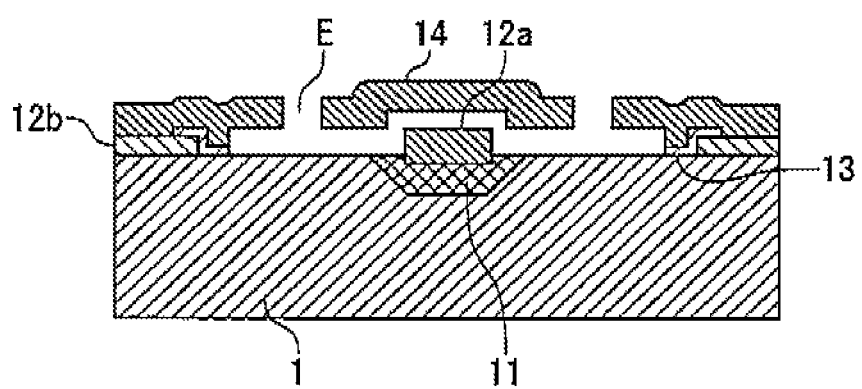
Figure 34:
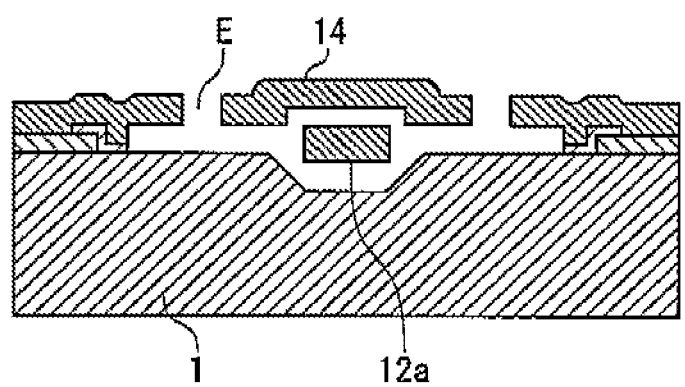
Figure 35:
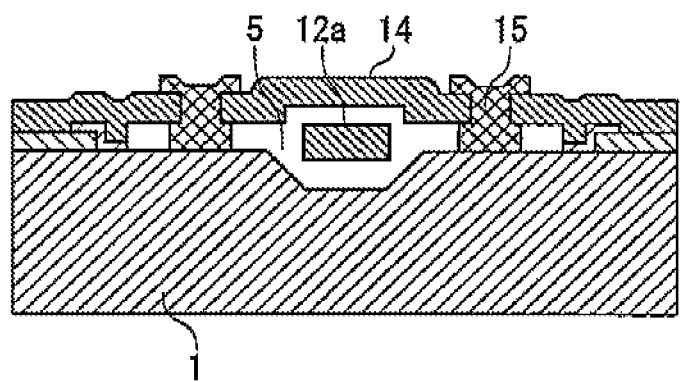
Figure 36:
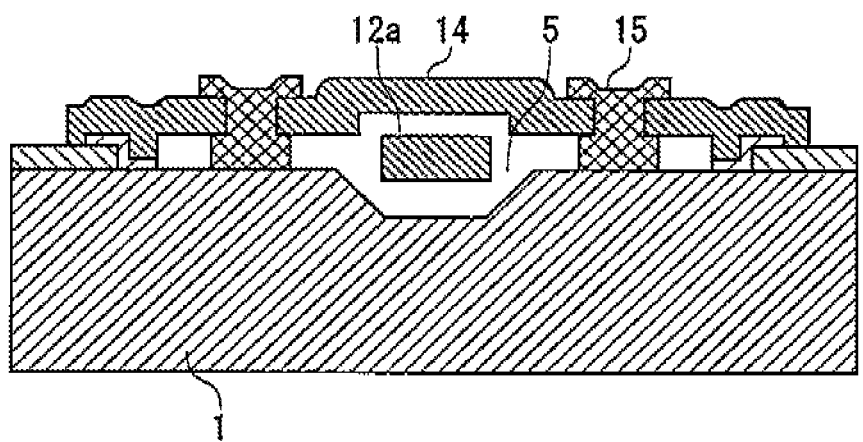
Figure 37:
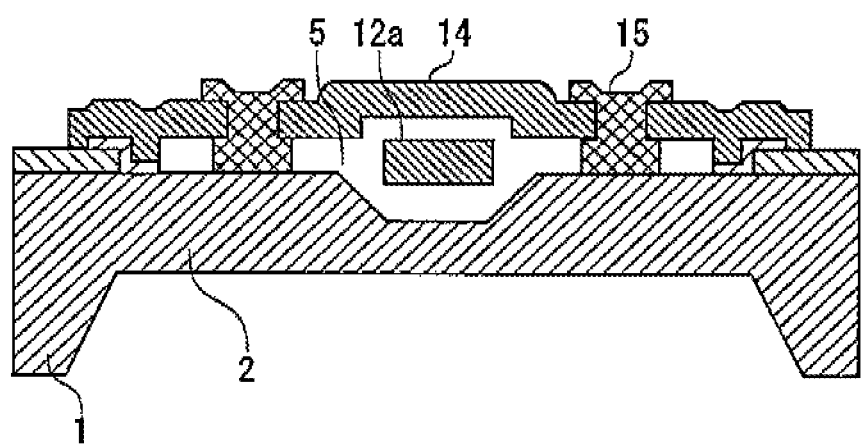
Figure 38A:
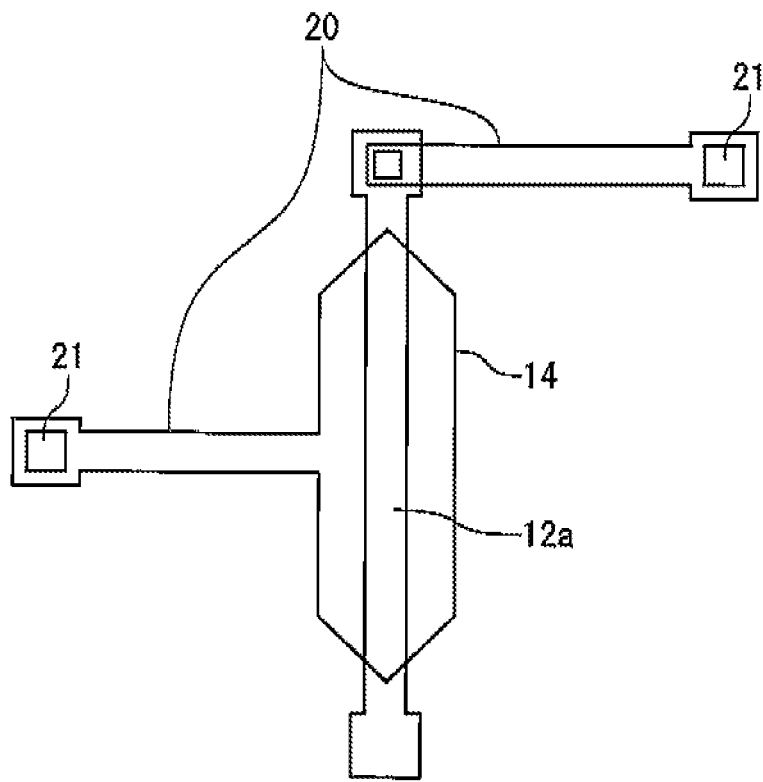
FIG. 38A is a plan view showing interconnections of the related-art vibration transducer.
Figure 38B:
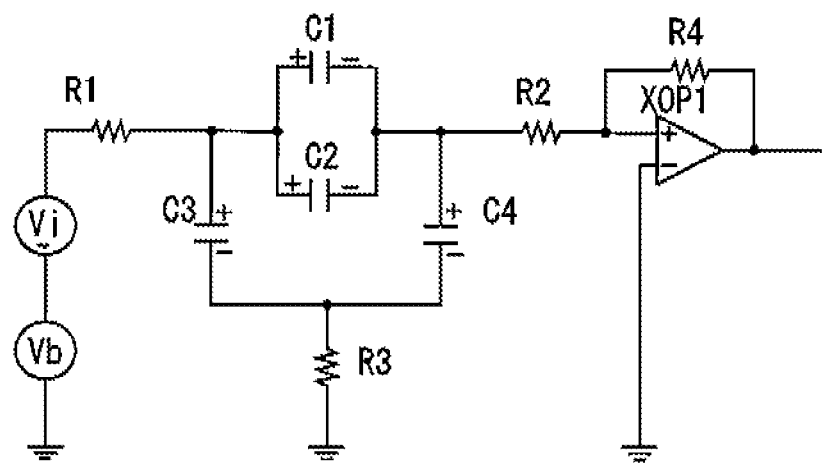
FIG. 38B is a circuit diagram of the related-art vibration transducer.
Figure 39:
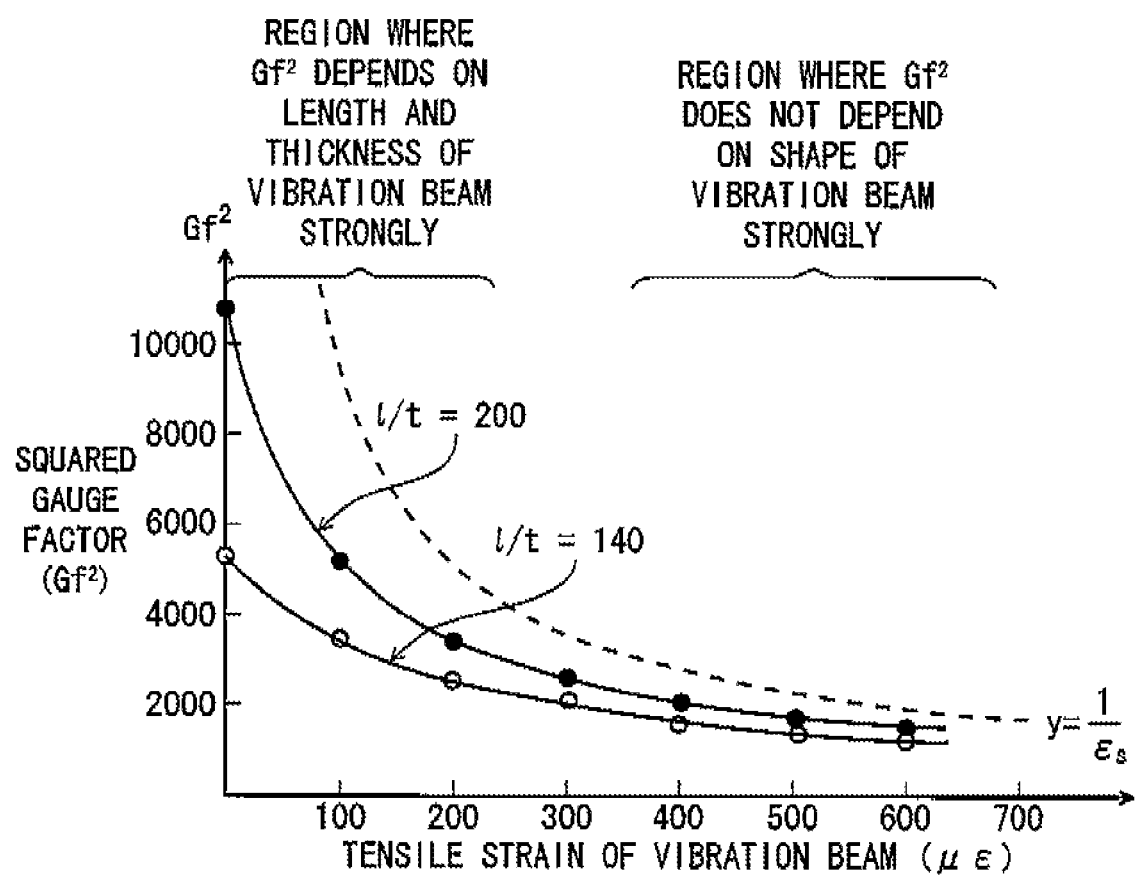
FIG. 39 is a graph corresponding to Formula 2.

The width L1 of the shell 38 can be made as small as, for example, about ¼ of the width L2 of the vibration beam 3 of the related-art vibration transducer of FIG. 28 by making the sectional shape of the vibration beam 32 long and narrow, that is, longer in the direction that is perpendicular to the surface of the substrate 31 than in the direction that is parallel with it. Where the shell thickness is the same, the withstanding pressure of the vibration transducer according to the invention can be made about four times as high as that of the related-art vibration transducer.

To realize the same withstanding pressure, the thickness of the shell 38 may be as thin as about ¼ of the thickness of the shell 4 of the related-art vibration transducer. Pressure P is applied from above.

In the related-art vertical vibration type vibration transducer of FIG. 28, the drive electrode should be formed on the shell 4 side. When high pressure is applied to the vibration transducer, the shell 4 may be deformed to vary the distance between the drive electrode and the vibration beam 3. This affects the electrostatic attractive force that acts on the vibration beam 3 to make the frequency variation characteristic nonlinear.

By virtue of the absence of a magnet, the vibration transducer can be used for purposes other than pressure sensors, such as strain gauges.

Capable of producing various vibration beams by merely switching the mask pattern (the manufacturing process remains the same), the manufacturing process can be applied to high-sensitivity acceleration meters and vibration gyros.

Particular preferred embodiments have been described above to explain and illustrate the invention. Therefore, the invention is not limited to the above embodiments and encompasses many changes and modification as long as they do not depart from the essential features of the invention.

What is claimed is:

1. A vibration transducer comprising:
    a silicon single crystal substrate;
    a silicon single crystal vibration beam provided over the silicon single crystal substrate, the vibration beam having a sectional shape that is longer in a height direction that is perpendicular to a surface of the silicon single crystal substrate than in a width direction that is parallel with the surface of the silicon single crystal substrate;
    a shell made of silicon, surrounding the vibration beam with a gap, and forming a vacuum room together with the silicon single crystal substrate;
    an exciting module configured to excite the vibration beam;
    a vibration detecting module configured to detect vibration of the vibration beam, and to measure stress occurring in the vibration beam by measuring a resonance frequency of the vibration beam;
    a first electrode plate disposed parallel with the surface of the silicon single crystal substrate, the first electrode plate having one end connected to the vibration beam;
    second and third electrode plates disposed parallel with the surface of the silicon single crystal substrate so as to be opposed to each other with the vibration beam interposed in between; and
    asperities formed on confronting side surfaces of the vibration beam and the second and third electrode plates,
    wherein the vibration beam, and the first, second and third electrode plates are located in the same plane extending parallel with the surface of the silicon single crystal substrate.

2. The vibration transducer according to claim 1, wherein the asperities on each surface are formed in a streaky structure or in lattice form so as to be continuous in one or both of directions that are parallel with and perpendicular to the surface of the silicon single crystal substrate, respectively.

3. The vibration transducer according to claim 1, wherein the second electrode plate is used as an excitation electrode configured to excite the vibration beam and the third electrode plate is used as a vibration detection electrode configured to detect vibration of the vibration beam.

4. The vibration transducer according to claim 1, wherein the first electrode plate is used as an excitation electrode configured to excite the vibration beam and the second or third electrode plate is used as a bias electrode configured to apply a DC bias voltage to the vibration beam and a vibration detection electrode configured to detect vibration of the vibration beam.

5. The vibration transducer according to claim 1,
    wherein a plurality of the second electrode plates and a plurality of the third electrode plates are disposed on two respective sides of an axis of the vibration beam; and
    wherein part of the plurality of second electrode plates are used as excitation electrodes and the other second electrode plates are used as detection electrodes, and part of the plurality of third electrode plates are used as detection electrodes and the other third electrode plates are used as excitation electrodes so that a vibration mode of the vibration beam is selected.

6. The vibration transducer according to claim 1, wherein the vibration beam is a double-end-fixed beam.

* * * * *